(12) United States Patent
Niederhofer et al.

(10) Patent No.: US 10,535,542 B2
(45) Date of Patent: Jan. 14, 2020

(54) WAFER BOX, METHOD FOR ARRANGING WAFERS IN A WAFER BOX, WAFER PROTECTION PLATE AND METHOD FOR PROTECTING A WAFER

(71) Applicant: Infineon Technologies AG, Neubiberg (DE)

(72) Inventors: Andreas Niederhofer, Regensburg (DE); Manfred Mengel, Bad Abbach (DE); Holger Tamme, Kreischa (DE); Nina Wenger, Villach (AT)

(73) Assignee: Infineon Technologies AG, Neubiberg (DE)

(*) Notice: Subject to any disclaimer, the term of this patent is extended or adjusted under 35 U.S.C. 154(b) by 171 days.

(21) Appl. No.: 15/662,293

(22) Filed: Jul. 28, 2017

(65) Prior Publication Data
US 2018/0033665 A1    Feb. 1, 2018

(30) Foreign Application Priority Data
Jul. 28, 2016    (DE) .................. 10 2016 113 924

(51) Int. Cl.
| | | |
|---|---|---|
| B65D 73/02 | (2006.01) | |
| H01L 21/677 | (2006.01) | |
| H01L 21/673 | (2006.01) | |
| H01L 21/683 | (2006.01) | |

(52) U.S. Cl.
CPC .... *H01L 21/67769* (2013.01); *H01L 21/6773* (2013.01); *H01L 21/67303* (2013.01); *H01L 21/67346* (2013.01); *H01L 21/67386* (2013.01); *H01L 21/67772* (2013.01); *H01L 21/67781* (2013.01); *H01L 21/6836* (2013.01)

(58) Field of Classification Search
CPC .... B65D 75/327; B65D 75/323; B65D 73/02; F27D 5/0025
USPC ....................... 206/710; 220/23.87
See application file for complete search history.

(56) References Cited

U.S. PATENT DOCUMENTS

| | | | |
|---|---|---|---|
| 6,099,302 | A | 8/2000 | Hong et al. |
| 7,181,132 | B2 | 2/2007 | De Ridder |
| 8,141,712 | B2 | 3/2012 | Wiseman et al. |
| 2011/0049087 | A1 | 3/2011 | Ferguson |
| 2015/0068948 | A1* | 3/2015 | Hong .................. H01L 21/6732 206/711 |

FOREIGN PATENT DOCUMENTS

| | | |
|---|---|---|
| JP | 2009154960 A | 7/2009 |
| WO | 2007092557 A2 | 8/2007 |
| WO | 2015130690 A1 | 9/2015 |

* cited by examiner

*Primary Examiner* — King M Chu
(74) *Attorney, Agent, or Firm* — Viering, Jentschura & Partner MBB

(57) ABSTRACT

Various embodiments provide a wafer box. The wafer box may include a housing with a receiving space for receiving at least one wafer arranged above a housing base, at least one fixing structure which is connected to the housing base and which extends from the housing base, and at least one fixing device which is fastenable to the at least one fixing structure at a variable distance from the housing base. The fixing device and the fixing structure are designed such that the at least one wafer for arrangement in the receiving space can be fixed in a position by means of the at least one fixing device fastened to the fixing structure.

18 Claims, 25 Drawing Sheets

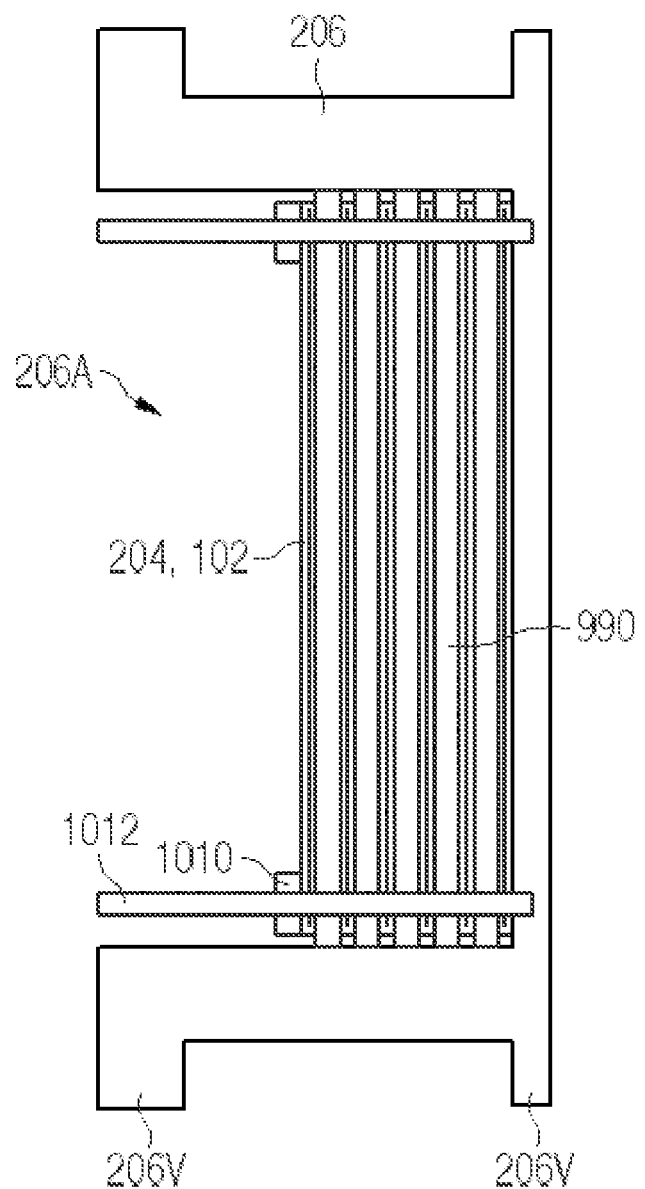

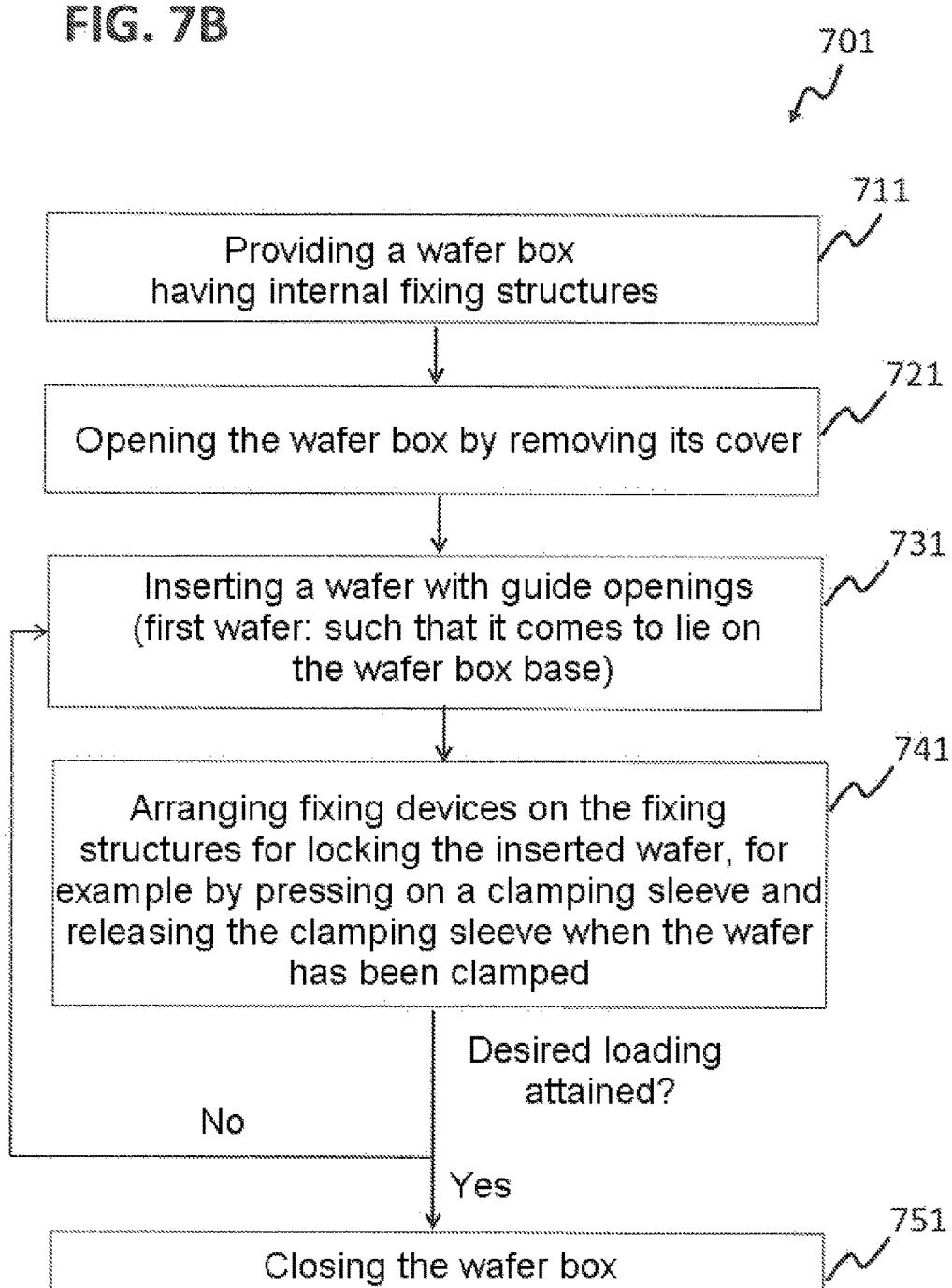

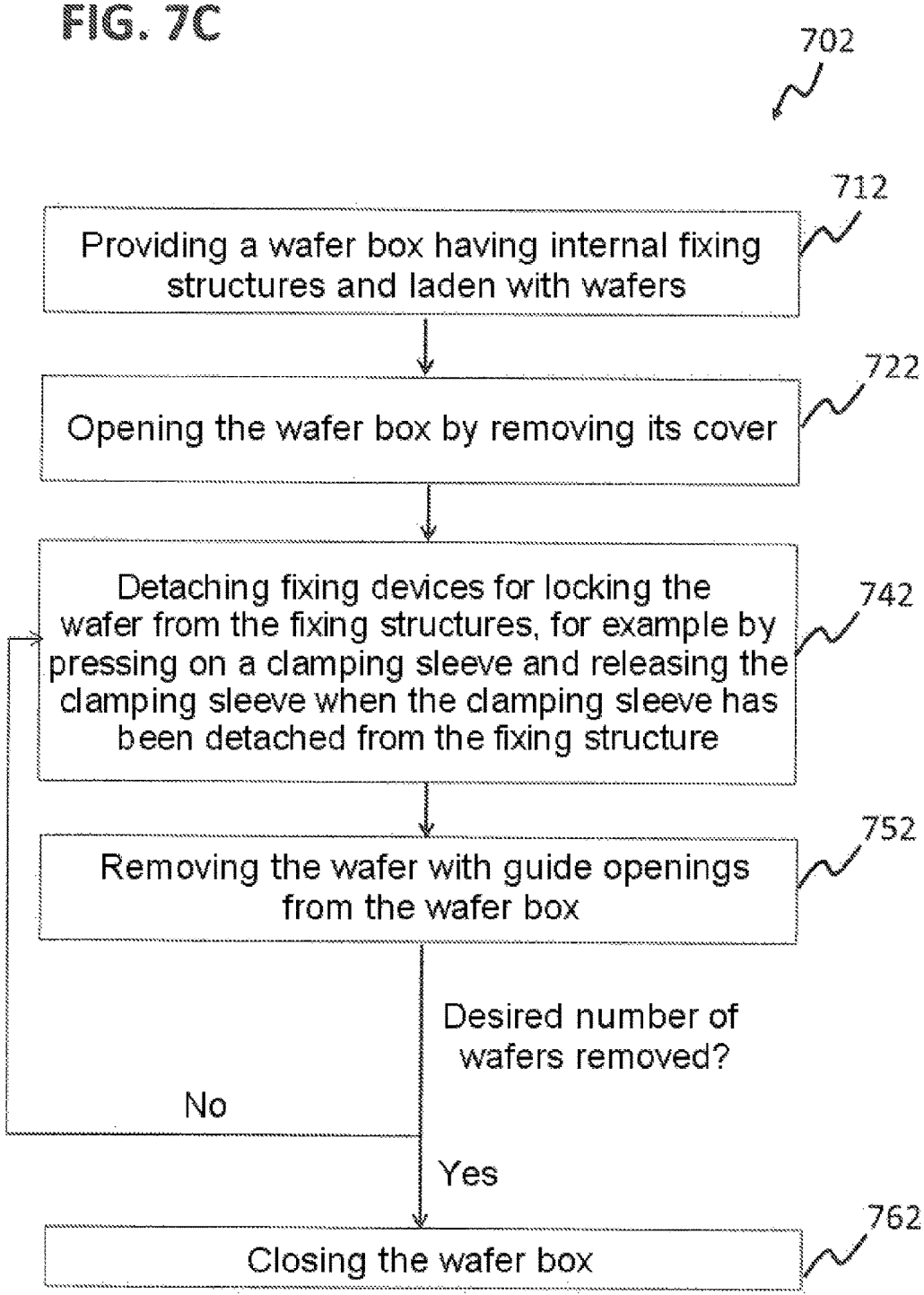

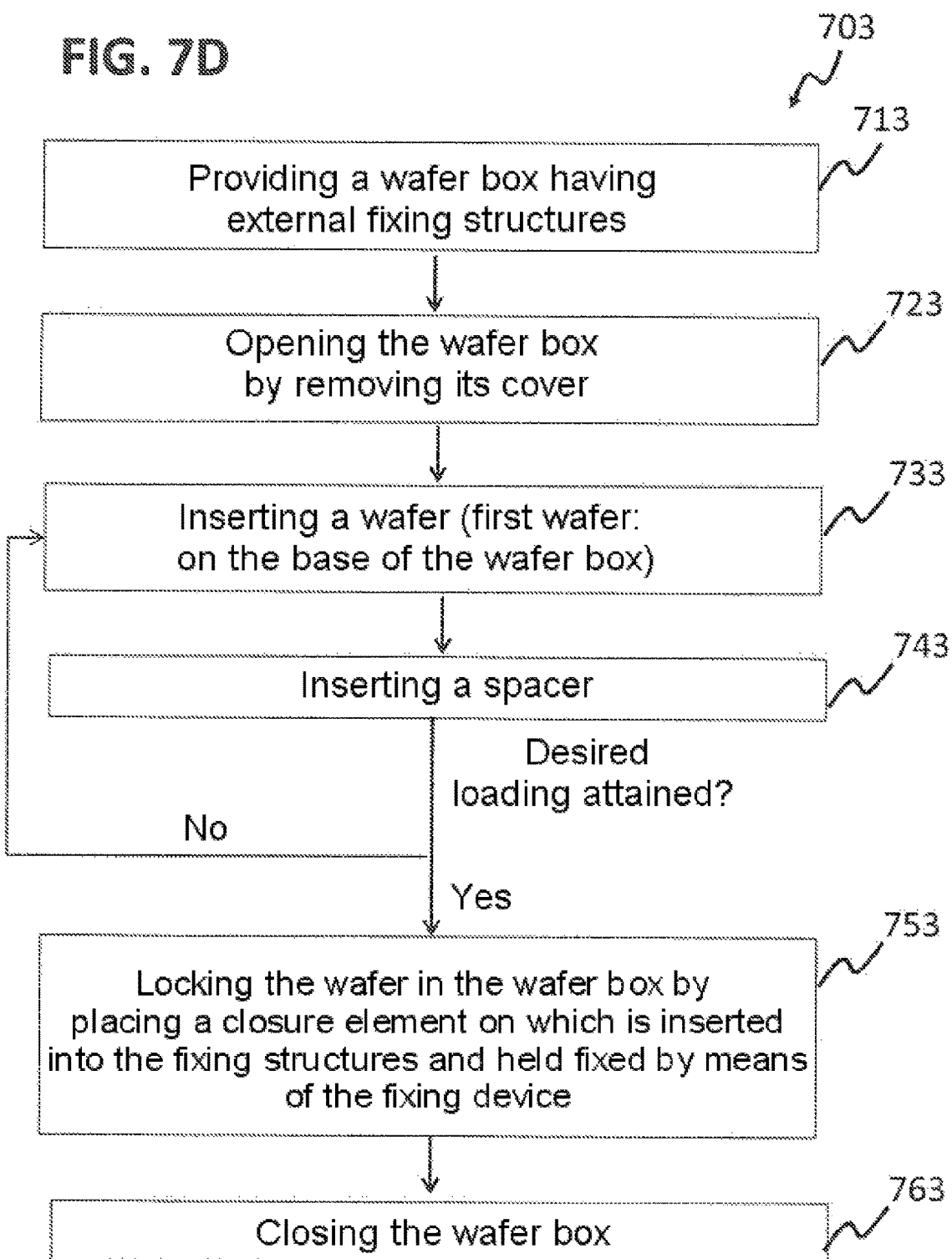

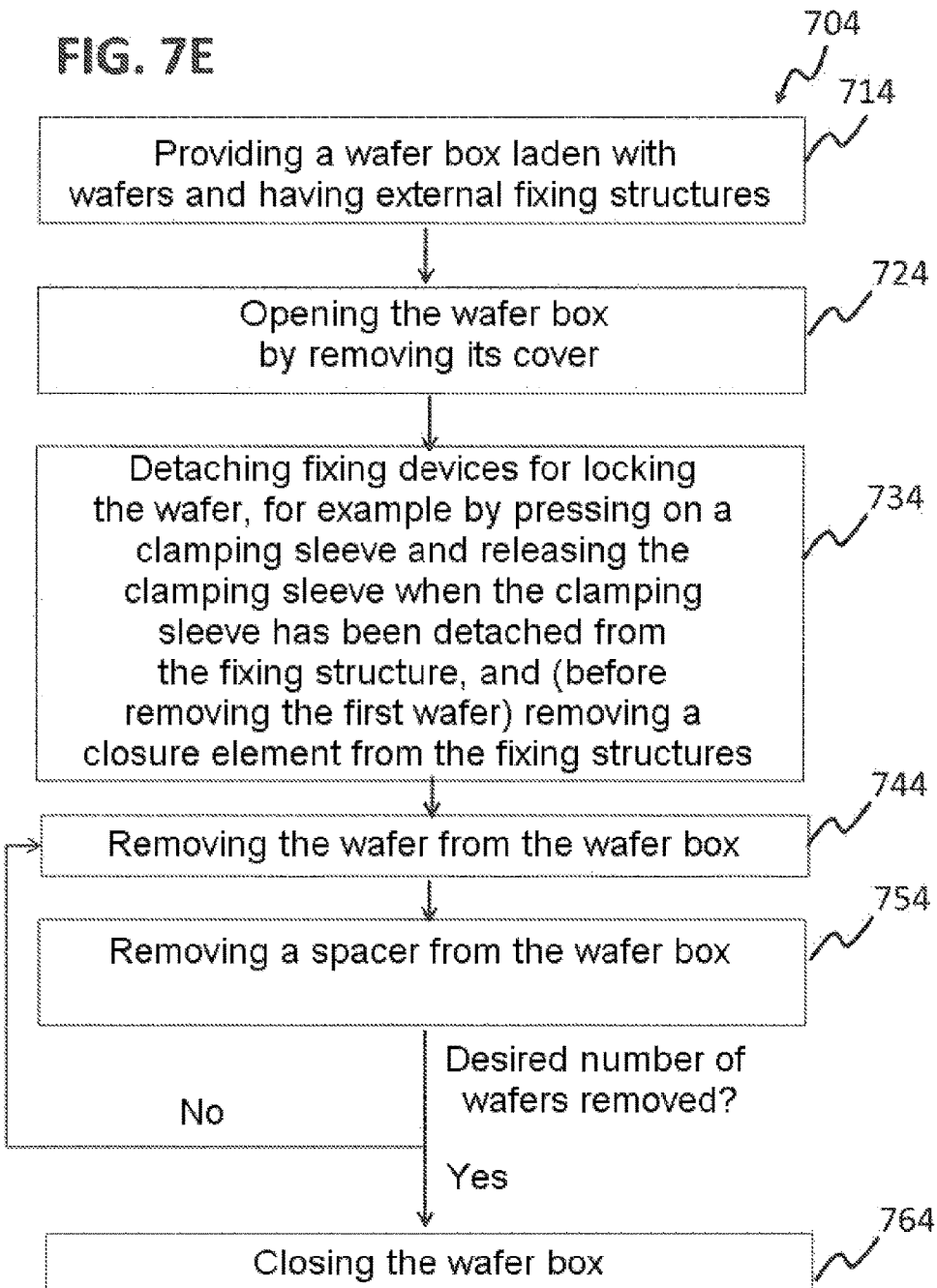

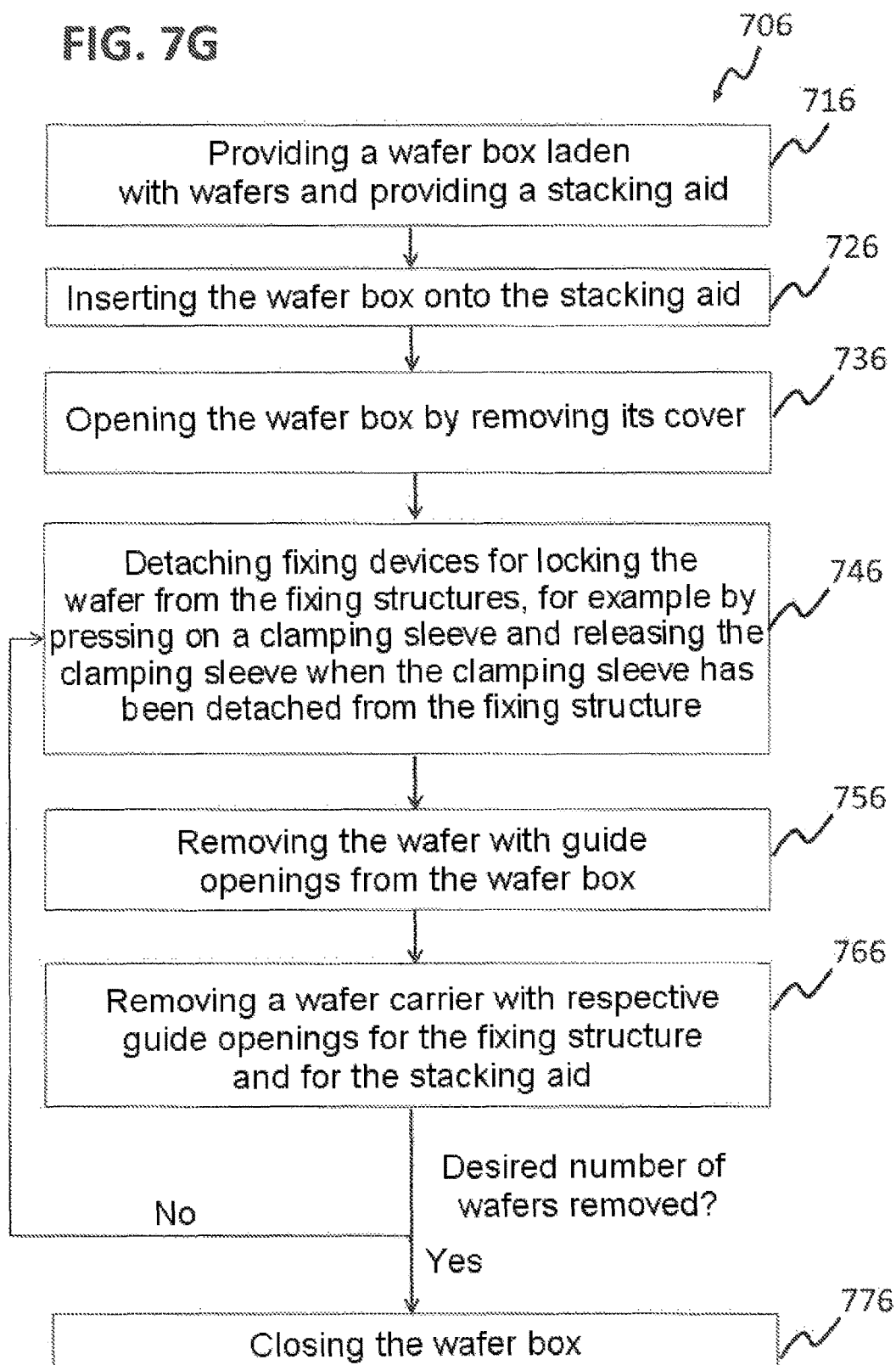

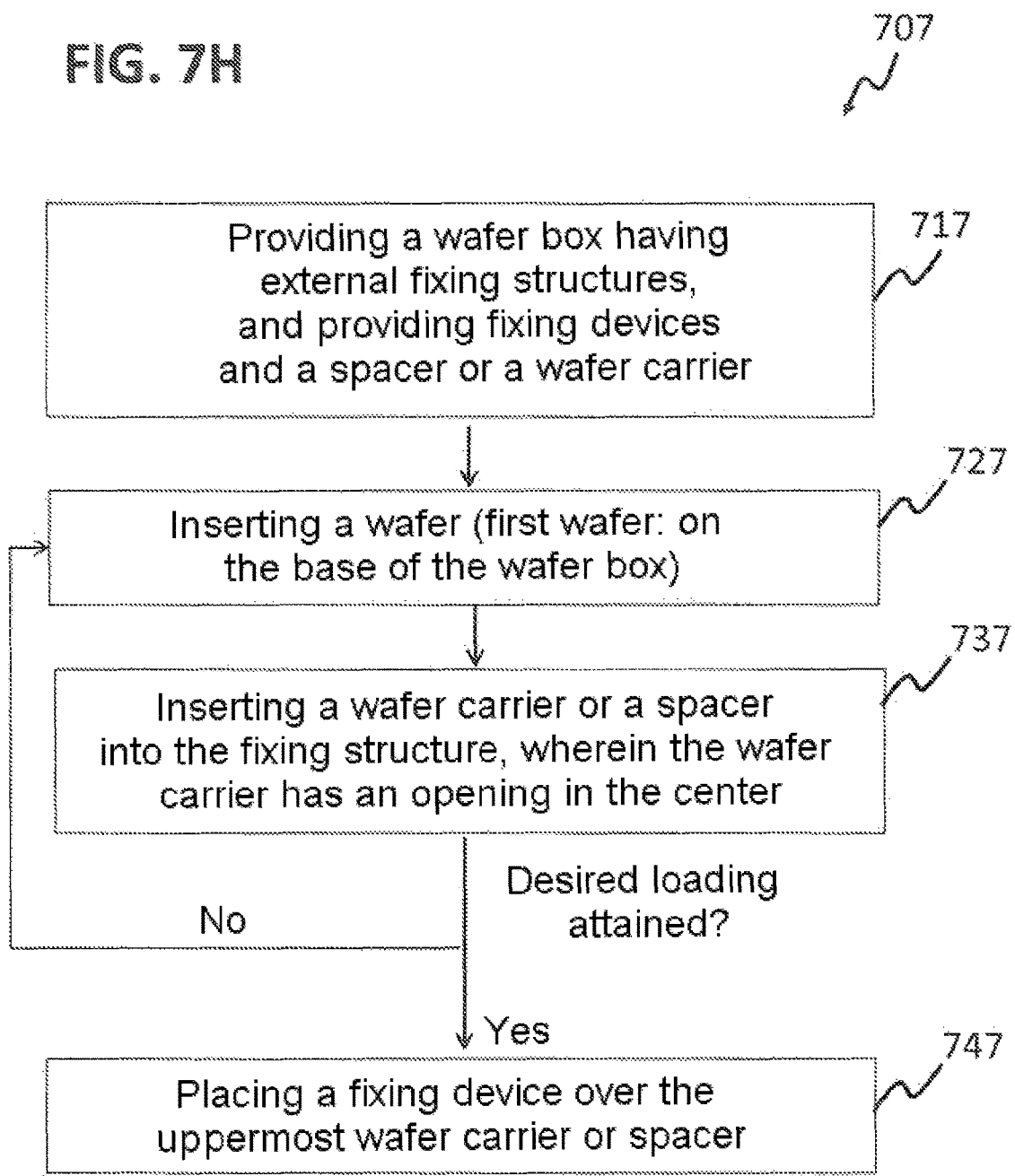

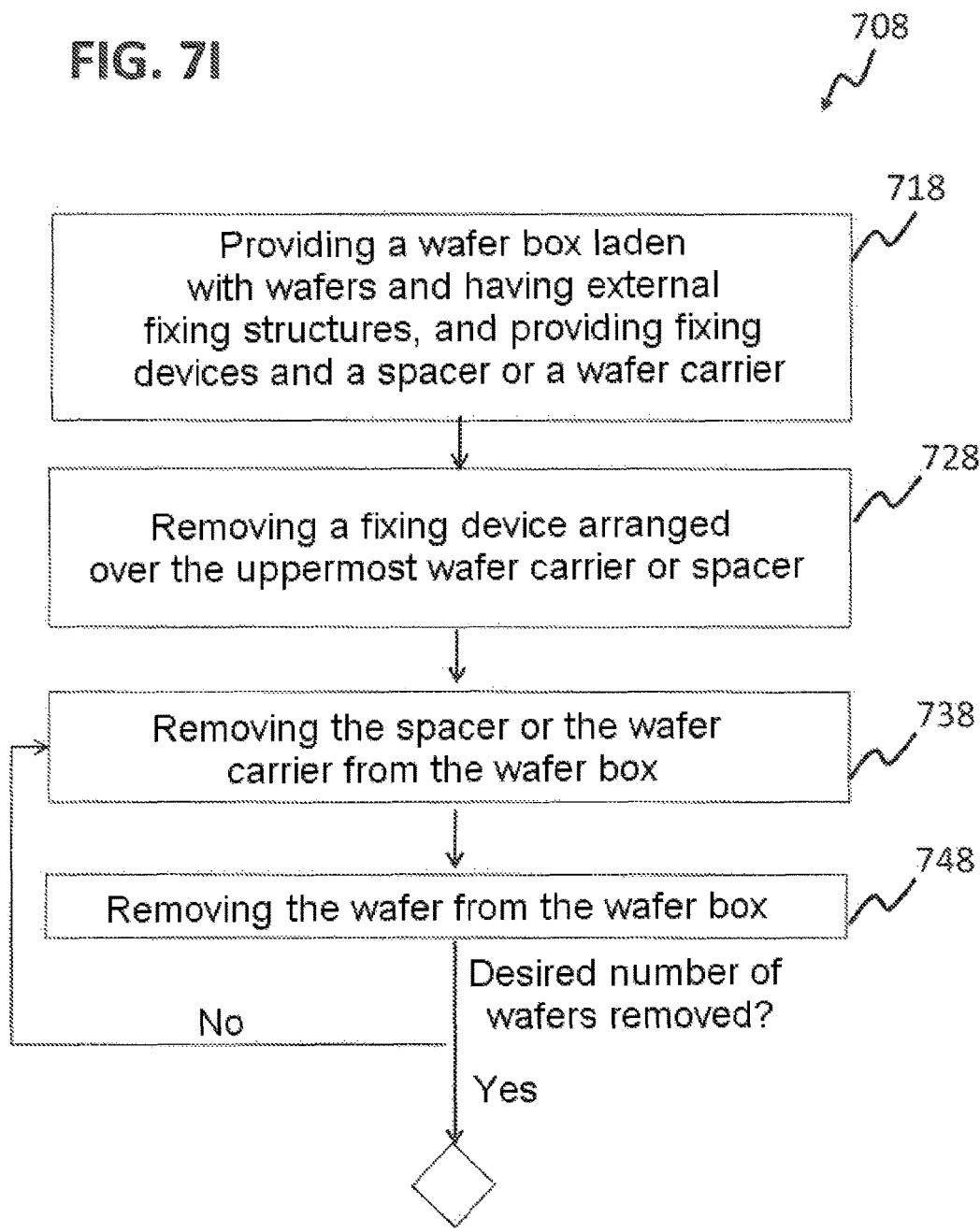

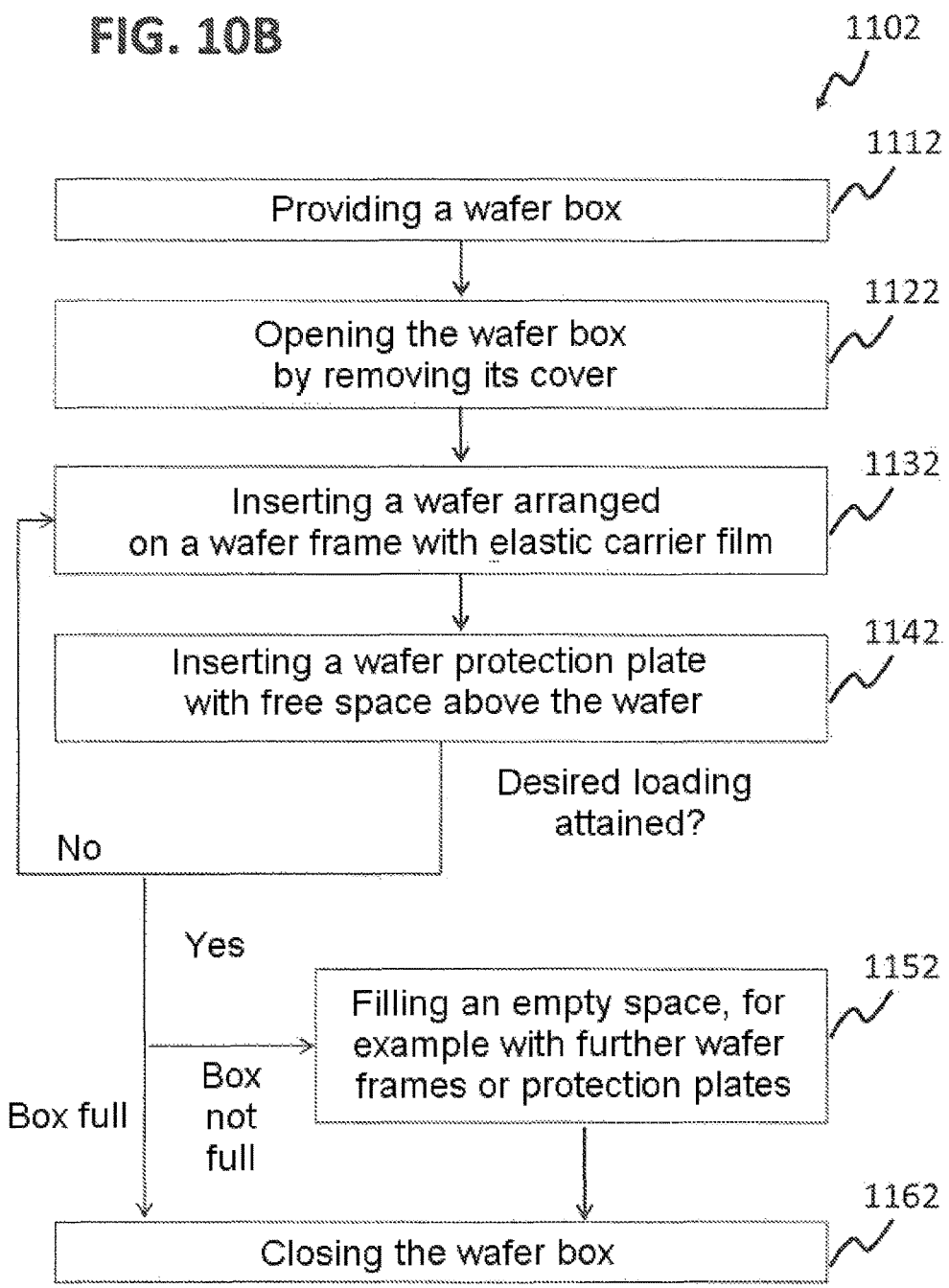

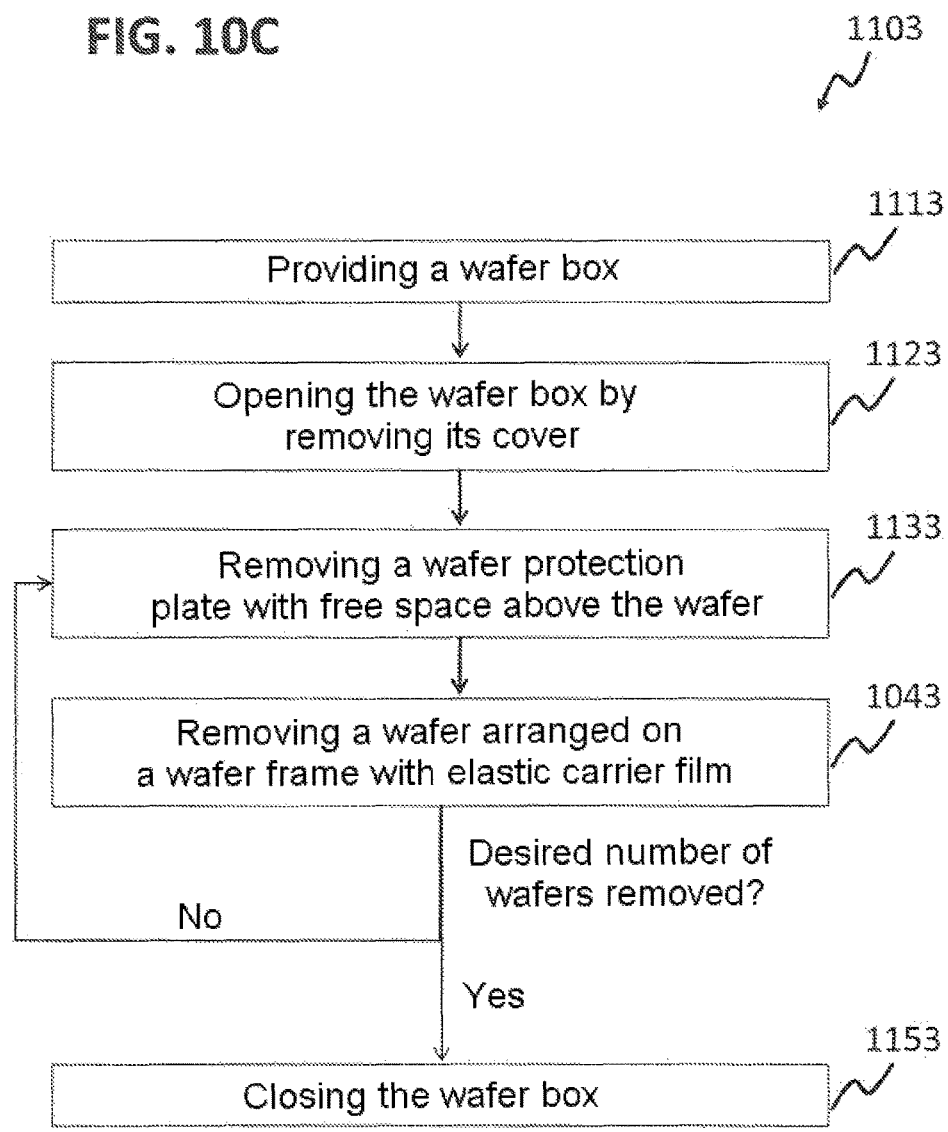

WAFER BOX, METHOD FOR ARRANGING WAFERS IN A WAFER BOX, WAFER PROTECTION PLATE AND METHOD FOR PROTECTING A WAFER

CROSS-REFERENCE TO RELATED APPLICATION

This application claims priority to German Patent Application Serial No. 10 2016 113 924.6, which was filed Jul. 28, 2016, and is incorporated herein by reference in its entirety.

TECHNICAL FIELD

Various embodiments relate generally to a wafer box, to a method for arranging wafers in a wafer box, to a wafer protection plate and to a method for protecting a wafer.

BACKGROUND

During the transport of sawn wafers, or of wafers generally, which are optionally separated into individual chips and arranged on a flexible carrier film, for example a sawing film, of a wafer frame, in conventional wafer transport containers, also referred to as wafer boxes or multi-frame shippers, damage to the wafers can occur.

The damage may be induced for example by touch. Here, for example, organic and/or inorganic contamination of the wafer surface, for example as a result of touching during transport, can lead to electrical faults or bonding problems. As a further consequence, inorganic contaminants such as ions can also lead to yield losses. A further risk point resulting from the wafer being touched may be scratches or imprints, which can adversely affect reliability.

Furthermore, the damage may be induced for example by vibrations and/or shocks. Owing to a flexibility of the sawing film, vibrations during transport can be transmitted to said sawing film. The vibrations induced (in the sawing film) can result in edges of the separated chips striking one another, resulting in so-called chipping, which can result in reliability problems. Likewise, there is the risk of chip losses resulting for example from slow detachment of the chips from the sawing film.

Touch prevention has hitherto been achieved for example by means of cassette-like vertical frame shippers (vertical in this context means that the wafers are arranged vertically in relation to a standing surface of the frame shipper) with a large slot spacing or horizontal frame shippers (horizontal means that the wafers are arranged horizontally in relation to a standing surface of the frame shipper) with the use of wafer intermediate inserts, or through the use of individual wafer boxes.

In the case of vertical frame shippers, the slot spacing is however not actually large enough that touch prevention can be 100% guaranteed.

In the case of horizontal frame shippers, some mechanical damage to the wafer surfaces has hitherto been partially prevented through the use of wafer intermediate inserts composed of paper or plastics-coated paper or by means of plastics films.

The use of individual wafer boxes could possibly solve the problem of vibrations, but would be very expensive with regard to packaging material and/or transportation costs, and furthermore would not be production-friendly with regard to a logistical process. A further effect would be an absence of automated handling of the wafers, and an increased storage volume of the packaged goods in-house and for the customer.

All of these already existing solutions are firstly very expensive and secondly do not afford one hundred percent protection of the wafer surface during transport. Furthermore, all wafer intermediate inserts comprise ionic contaminants or ionic components (for example sodium (Na) and/or potassium (K)) which, in the case of certain technologies, can lead to problems.

If the wafers (for example mounted on the wafer frame) are shipped to the customer or in-house having been packaged in the conventional manner in wafer boxes, round foam blanks are typically used to fill the boxes. These can lead to additional costs, for example inter alia in the so-called "bare die" business sector, that is to say in the marketing of unhoused, uninstalled chips (also referred to as dies), because the round foam blanks are normally not reusable.

Furthermore, particles from the foam can contaminate the wafer surface. Furthermore, the foam may release organic gases which, after removal from storage, can give rise to problems during further processing of the wafers (for example in a die bonding process).

Thus, during conventional transport, the filling of the wafer boxes with round foam blanks can result in a risk of particle or chemical contamination and in increased costs.

SUMMARY

Various embodiments provide a wafer box. The wafer box may include a housing with a receiving space for receiving at least one wafer arranged above a housing base, at least one fixing structure which is connected to the housing base and which extends from the housing base, and at least one fixing device which is fastenable to the at least one fixing structure at a variable distance from the housing base. The fixing device and the fixing structure are designed such that the at least one wafer for arrangement in the receiving space can be fixed in a position by means of the at least one fixing device fastened to the fixing structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 6 shows a schematic cross-sectional view of a wafer box according to various embodiments;

FIGS. 7A to 7I each show a flow diagram for a method for arranging wafers in a wafer box or for removing wafers from a wafer box according to various embodiments;

FIGS. 10B and 10C each show a flow diagram for a method for arranging wafers in protected fashion in a wafer box or for removing protected wafers from a wafer box according to various embodiments.

DESCRIPTION

In the following detailed description, reference will be made to the appended drawings, which form part of this description and which, for illustrative purposes, show specific embodiments in which the invention can be implemented. In this regard, directional terminology such as for example "upward", "downward", "forward", "backward", "front", "rear" etc. is used with regard to the orientation of the described figure(s). Since components of embodiments can be positioned in a number of different orientations, the directional terminology serves for illustrative purposes and is in no way restrictive. It is self-evident that other embodiments may be utilized, and structural or logical modifications made, without departing from the scope of protection of the present invention. It is self-evident that the features of the various embodiments described herein may be combined with one another unless specifically stated otherwise. The following detailed description therefore should not be regarded as being restrictive, and the scope of protection of the present invention is defined by the appended claims.

In the context of this description, the expressions "connected", "attached" and "coupled" are used to describe both a direct and an indirect connection, a direct or indirect attachment and a direct or indirect coupling. In the figures, identical or similar elements have been denoted by identical reference designations were expedient.

Here, unless stated otherwise, lifting of a wafer in a wafer box or out of a wafer box is to be understood to mean that the wafer is moved away from a base of the wafer box, for example even in a situation in which the wafer box is, during a process of loading with wafers or during a removal of wafers therefrom, arranged with its base substantially parallel to gravitational force, and thus conventional lifting (that is to say counter to gravitational force) is not performed.

Figure 1A:
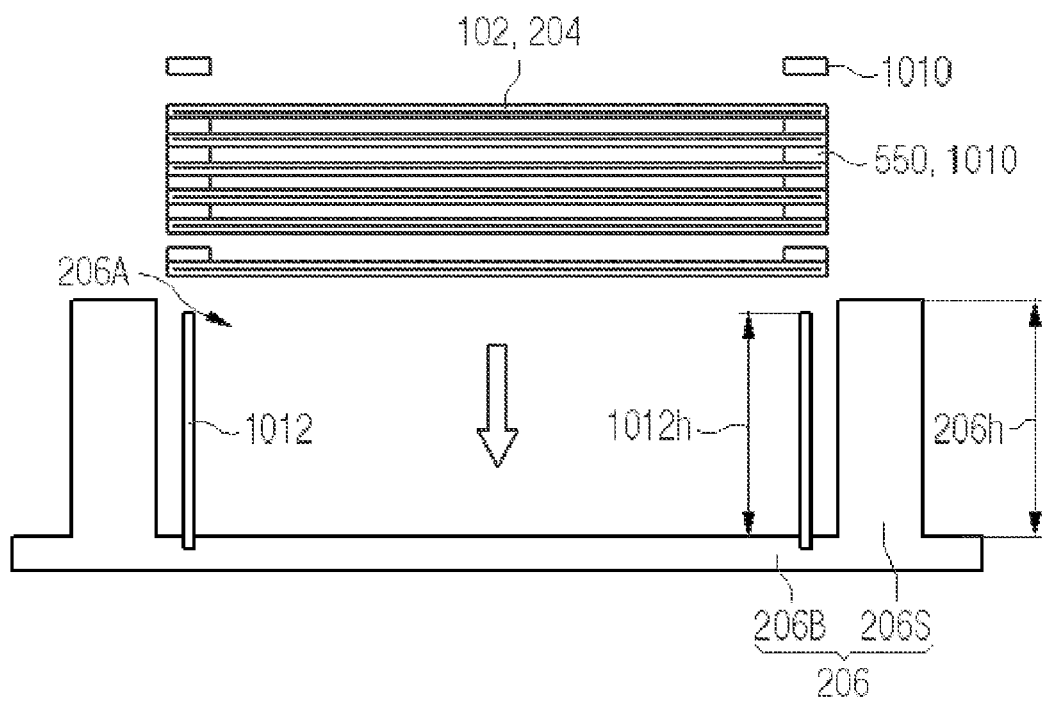
FIGS. 1A and 1B show schematic cross-sectional views for the purposes of illustrating an arrangement of wafers in a wafer box according to various embodiments.
Figure 1B:
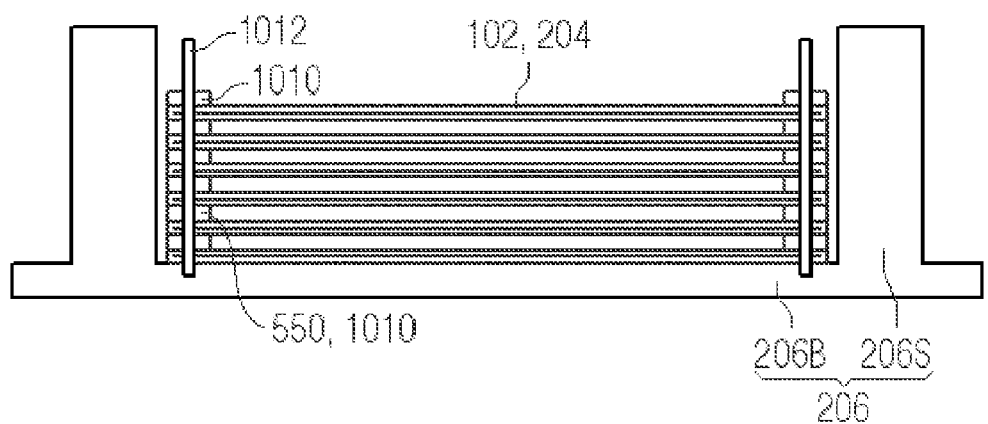

FIG. 1A and FIG. 1B show schematic cross-sectional views for illustrating an arrangement of a multiplicity of wafers 102 in a wafer box 206 according to various embodiments.

In various embodiments, the wafer box 206 may have a housing with a receiving space 206A for receiving a multiplicity of wafers 102, wherein each wafer 102 of the multiplicity of wafers 102 may be arranged on a wafer carrier 204. The housing may furthermore have a housing base 206B. The receiving space 206A may be delimited by at least one side wall 206S and by at least a part of the housing base 206B, wherein the at least one side wall 206S may extend from the housing base 206B to a height 206h above the housing base 206B. An edge, averted from the housing base 206B, of the at least one side wall 206S may be situated at a height (that is to say a spacing) 206h above the housing base 206B.

In various embodiments, the receiving space 206A may be substantially cylindrical, for example in a situation in which the wafer carriers 204, 226 are formed as a substantially circular surface. In various embodiments, the receiving space 206A may have a different shape, for example cuboidal, cubic or some other suitable shape.

In various embodiments, the wafer box 206 may be designed such that the multiplicity of wafers 102 can be arranged therein with main surfaces of the wafers 102 parallel to the housing base 206B.

In various embodiments, the wafer box 206, for example the housing of the wafer box 206, may have or be formed from a plastics material, for example a thermoplastic, for example polypropylene. For example, use may be made of materials which are typically used for producing wafer boxes.

The at least one fixing structure 1012 can be arranged on the housing base 206B such that the (if appropriate multiplicity of) fixing structure(s) 1012 are/is situated outside a region in which the wafers 102 are to be arranged, and instead for example in a region in which a marginal region of a wafer carrier 204 on which the wafer is situated is to be arranged.

In various embodiments, the wafer carrier 204 may be similar to a conventional wafer frame, for example may deviate from conventional wafer frames with regard to dimensions, design, materials etc. but have at least one guide opening 220.

In various embodiments, the wafer carrier 204 may have a frame part 204R and a surface part 204F. The surface part 204F may for example have a carrier film, for example a sawing film, on which the wafer 102 can be arranged for a separation of the wafer 102 into individual chips. In various embodiments, the surface part 204F of the wafer carrier 204 may be flexible, for example elastic, for example if the surface part 204F has a sawing film. In various embodiments, the frame part 204R may be rigid. The frame part 204R may for example be manufactured from plastic, for example by injection molding, or may have a plastic. The plastic may for example be or have a thermoplastic, for example polypropylene. In various embodiments, the frame part 204R may be manufactured from metal.

In various embodiments, the wafer 102 arranged on the wafer carrier 204 may be an unseparated wafer 102. In various embodiments, the wafer 102 may be a separated wafer, for example a wafer 102 that has been separated into individual chips (also referred to as dies).

In various embodiments, the wafer 102 arranged on the wafer carrier 204 may be fastened to the wafer carrier 204, for example by means of an adhesive. In various embodiments, the wafer 102 arranged on the wafer carrier 204 may be supported, for example loosely supported, on the wafer carrier 204.

The at least one fixing structure 1012 may for example be formed as a web, bar, hollow cylinder or in any other form which allows the functionality of the at least one fixing structure 1012 to be provided, that is to say a fastening of the fixing device 1010 to the fixing structure 1012 to be permitted, such that the at least one wafer to be arranged in the receiving space 206A can be fixed in a position by means of the at least one fixing device 1010 fastened to the fixing structure 1012.

In various embodiments, the at least one fixing structure 1012 may be arranged so as to extend within the receiving space 206A into the wafer box 206. Here, the at least one fixing structure 1012 may be arranged so as to extend through a margin 204R of the wafer carrier 204, for example through a region between an outer edge of the wafer 102 arranged on the wafer carrier 204 and an outer edge of the wafer carrier 204. For this purpose, openings may be formed in the wafer carrier 204 for the purposes of receiving the fixing structure 1012. The wafer carrier 204 can differ from the conventional wafer carrier 104, which is used for example in the embodiments illustrated in FIG. 3A, FIG. 3B, FIG. 3C, FIG. 5A, FIG. 5B and FIG. 5C, by the openings (not illustrated) formed in the wafer carrier 204.

In various embodiments, if the fixing structure 1012 has the multiplicity of fixing structures 1012, the fixing structures 1012 may be distributed uniformly over the circumference of the housing base 206B. In other words, the multiplicity of fixing structures 1012 may be arranged with uniform angular spacings between one another. For example, two fixing structures 1012 may be arranged opposite one another, which may correspond to an angular spacing of 180° between them, three fixing structures 1012 may be arranged as if situated at corners of an equilateral triangle, which may correspond to an angular spacing of in each case 120° between adjacent fixing structures 1012, four fixing structures 1012 may be arranged as if situated at corners of a square, which may correspond to an angular spacing of in each case 90° between adjacent fixing structures 1012, etc.

In various embodiments, the multiplicity of fixing structures 1012 may be distributed non-uniformly over the circumference of the housing base 206B. By means of the non-uniform distribution, a number of possible (angular) positions of the wafer 102 in the wafer box 206 can be limited, for example such that only one single angular position can be assumed by the wafer 102 arranged on the wafer carrier 204.

In various embodiments, a height to which the at least one fixing structure 1012 extends above a top side of the housing base 206B, that is to say above a side of the housing base 206B facing toward the receiving space 206A, may be referred to as fixing structure height 1012h. The fixing structure height 1012h may be greater than a sum of wafer frame thickness and height of the fixing device 1010, for example greater than approximately 1 cm, for example greater than approximately 2 cm, for example greater than approximately 5 cm. The fixing structure height 1012h may lie in a range from approximately 1 cm to a wafer box side wall height 206h, for example from approximately 1 cm to approximately 20 cm, for example from approximately 2 cm to approximately 12 cm, for example from approximately 5 cm to approximately 10 cm.

In various embodiments, the at least one fixing device 1010 may be fastened (also referred to as fastenable) to the at least one fixing structure 1012 at any desired distance (up to the fixing structure height 1012h) from the housing base 206B. Fixing of any desired number of wafers 102 (up to a maximum number of wafers 102 that can be arranged in the receiving space 206A) can thus be made possible.

In various embodiments, the at least one fixing structure 1012 may have a length substantially parallel to or along an edge (for example an outer margin) of the wafer carrier, which length may lie in a range from approximately 5 mm to approximately half of one wafer carrier circumference, for example in a range from approximately 5 mm to approximately 10 cm, for example from approximately 1 cm to approximately 3 cm.

In various embodiments, the at least one fixing structure 1012 may have a width perpendicular to the length, which width may lie in a range from approximately 5 mm to approximately 3 cm, for example in a range from approximately 5 mm to approximately 2 cm, for example approximately 1 cm.

In various embodiments, the at least one fixing structure 1012 may for example have at least one bar with a circular cross section which has a diameter from approximately 5 mm to approximately 12 mm, for example a diameter of approximately 1 cm.

In various embodiments, the at least one fixing structure 1012 may have or be formed from a metal, for example a corrosion-resistant metal. In various embodiments, the at least one fixing structure 1012 may have a plastic, for example a thermoplastic, for example polypropylene, or any other suitable material which is rigid and durable enough to permit the fixing of the multiplicity of wafers 102. In various embodiments, the at least one fixing structure 1012 may be injection-molded. In various embodiments, the at least one fixing structure 1012 may be formed in one piece with the base plate 224. In various embodiments, the at least one fixing structure 1012 may be detachably connected to the housing base 206B, for example by being screwed on or screwed in, plugged in or the like. The at least one fixing structure 1012 may for example extend substantially perpendicular to the housing base 206B.

In various embodiments, the at least one fixing structure 1012 may be of conical form at its tip, that is to say at its free end averted from the housing base 206B. The insertion of the at least one fixing structure 1012 into the at least one opening in the wafer carrier (for example the wafer frame) 204 can thus be facilitated.

In various embodiments, the wafer box 206 may be designed such that the housing base 206B is provided for being arranged substantially horizontally on a horizontal underlying surface, that is to say with its main surfaces substantially parallel to the horizontal underlying surface, as illustrated by way of example in FIG. 1A and FIG. 1B.

In various embodiments, the wafer 102 arranged on the wafer carrier (for example the wafer frame) 204 may be fastened in the receiving space 206A of the wafer box 206 by virtue of the at least one fixing device 1010 being fastened to the at least one fixing structure 1012.

In various embodiments, the at least one fixing device 1010 may be fastened to the fixing structure 1012 such that the fixing device 1010 is in contact with the wafer frame 204. This is illustrated by way of example in FIG. 1A, FIG. 1B, FIG. 4A, FIG. 4B and FIG. 6, wherein FIG. 1A and FIG. 1B furthermore illustrate an arrangement of a multiplicity of the wafers 102 arranged on wafer carriers (for example wafer frames) 204 in the wafer box 206, wherein the multiplicity of wafers is arranged as a stack within the receiving space 206A of the wafer box 206, and then the fixing device 1010 can be arranged above the final wafer carrier 204 so as to be in contact with the wafer carrier 204.

In various embodiments, the fixing device 1010 may exert a force directed in the direction of the housing base 206B.

In various embodiments, the fixing device 1010 may have a clamping device, a screw device (for example a nut or a ring with a radial screw) or any other suitable fixing device.

In various embodiments, the fixing device 1010 may be movable, for example displaceable, along the fixing structure 1012. For example, the fixing device may be of sleeve-like form or formed as part of a sleeve which can be pushed onto the fixing structure 1012 and moved along the latter.

In various embodiments, the fixing device 1010 may be formed such that it is fastenable, that is to say can be fastened, from one side to the fixing structure 1012. This may possibly render it unnecessary for the fixing device 1010 to be movable along the fixing structure 1012.

In various embodiments, locking and/or release of the fixing device 1010 may by means of a screw connection, for example longitudinally along the fixing structure 1012, for example by virtue of the fixing device 1010 being in the form of a nut and the fixing structure 1012 being equipped with a matching thread, or for example radially, by virtue of the fixing device 1010 having a radial screw which can be screwed against or into the fixing structure 1012 such that the fixing device 1010 is fixed to the fixing structure 1012.

In various embodiments, the locking may be effected by means of a restoring force, for example by means of a spring force.

In various embodiments, the fixing device 1010 may be detachably fastenable, for example repeatedly detachable and refastenable, to the fixing structure 1012. Thus, for example, a removal of individual wafers 102 can be made possible with (repeated) use of the same fixing structure(s).

Figure 2A:
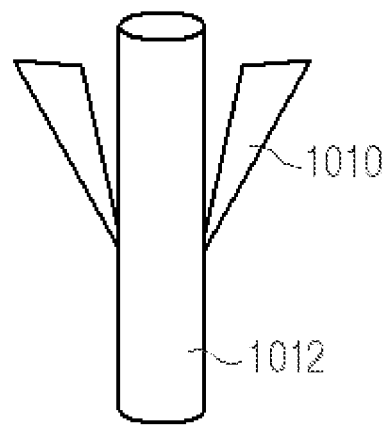
FIG. 2A is a schematic illustration of a fixing device according to various embodiments in a clamping state.
Figure 2B:
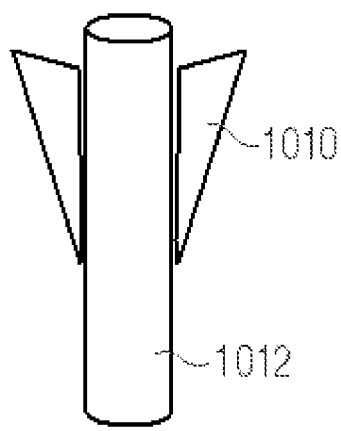
FIG. 2B is a schematic illustration of a fixing device according to various embodiments in a state in which it is freely movable along a fixing structure.

As an example for the fixing device, FIG. 2A illustrates a clamping sleeve 1010 in a clamping state on the fixing structure 1012, and FIG. 2B illustrates the same fixing structure 1012 in a released state, in which the clamping sleeve 1010 can be movable along the fixing structure 1012. In various embodiments, the fixing device 1010 in FIG. 2A may have or be formed from a plastic. The clamping sleeve 1010 can for example be changed, by exertion of pressure, from a conical shape into a cylindrical shape adapted to the fixing structure 1012, for example to a (cylindrical) bar or a hollow cylinder. Here, the plastic in the conical shape can exert pressure on the fixing structure for fastening purposes, and can be unlocked by pressure in order to be deformed to form the cylinder.

In various embodiments, if the at least one fixing device 1010 has a multiplicity of fixing devices 1010 and the at least one fixing structure 1012 has a multiplicity of fixing structures 1012, one fixing device 1010 can be arranged on each of the fixing structures 1012.

In various embodiments, by means of the at least one fixing structure 1012 and the at least one fixing device 1010, it can be achieved that the at least one wafer 102 that can be attached to the wafer carrier (for example the wafer frame) 204 is securely held in the wafer box 206, for example in the receiving space of the wafer box 206, that is to say is protected against performing uncontrolled movements or being moved in uncontrolled fashion in the receiving space 206A, even in a situation in which the receiving space 206A has not been completely filled with wafers 102. Thus, the wafer 102 can be protected against damage, for example during transport.

In various embodiments, in each case between two wafer carriers 204 with wafers 102 arranged thereon, a multiplicity of the fixing devices 1010 can be arranged on the multiplicity of fixing structures 1012. Here, the fixing devices 1010 may be designed so as to perform not only the locking function but also a spacer function. In other words, the wafers 102 which are individually locked by means of the fixing devices 1010 and the fixing structures 1012 can be arranged by means of the fixing devices 1010 so as not to come into contact either with one another or with any of the other wafer carriers 204.

In various embodiments, spacers 550 can be arranged in each case between two wafer carriers 204 with wafers 102 arranged thereon. In various embodiments, the spacers 550 may be positioned by means of the fixing structures 1012. For this purpose, the spacers 550 may have in each case one positioning opening.

In various embodiments, the positioning by means of the fixing structures 1012 makes it possible for the spacers 550 to be formed so as to be small and of simple design, for example as sleeves surrounding in each case one of the fixing structures 1012. The spacers 550 which are provided for positioning around the individual fixing structures 1012 may be formed with an identical shape to one another. In other words, the spacers 550 may be formed such that each spacer 550 can be arranged around each of the fixing structures 1012.

In various embodiments, to achieve a uniform vertical spacing over the entire main surface of the stacked wafers 102 (that is to say perpendicular to the main surface), at least three spacers 550 may be positioned between two wafers 102. Accordingly, at least three fixing structures 1012 can be provided.

In various embodiments, the spacers 550 may be used if the wafers 102 project out of a plane which is defined by the main surfaces of the wafer carriers 204, for example wafer frames, such that, when the wafers 102 arranged on the wafer carriers 204 are stacked, the wafers 102 could come into contact with the respective wafer carrier 204 situated thereabove. This could be the case for example when using thin metal wafer frames as wafer carriers 204, and/or for example in the case of thick wafers 102, for example wafers with tall structures, for example micromechanical components or the like.

Figure 3A:
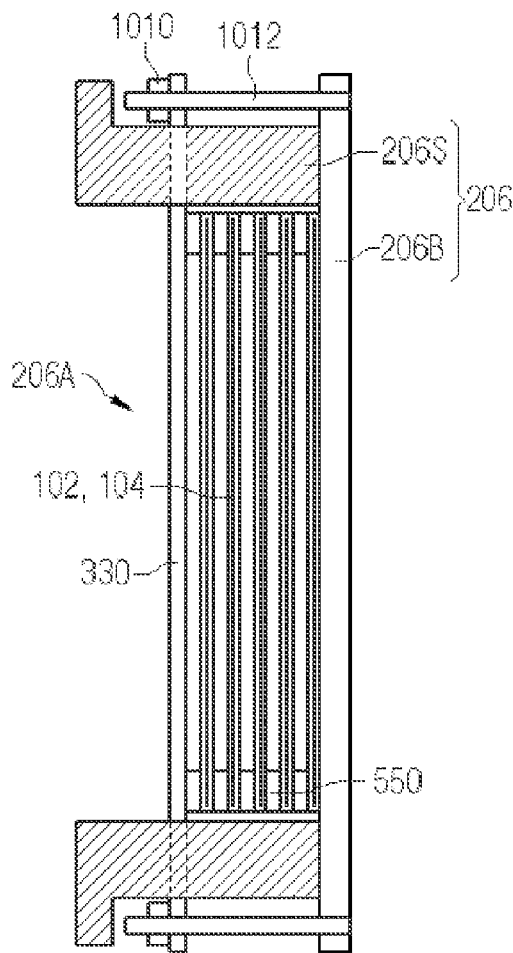
FIGS. 3A and 3B each show a schematic cross-sectional view of a wafer box according to various embodiments.
Figure 3B:
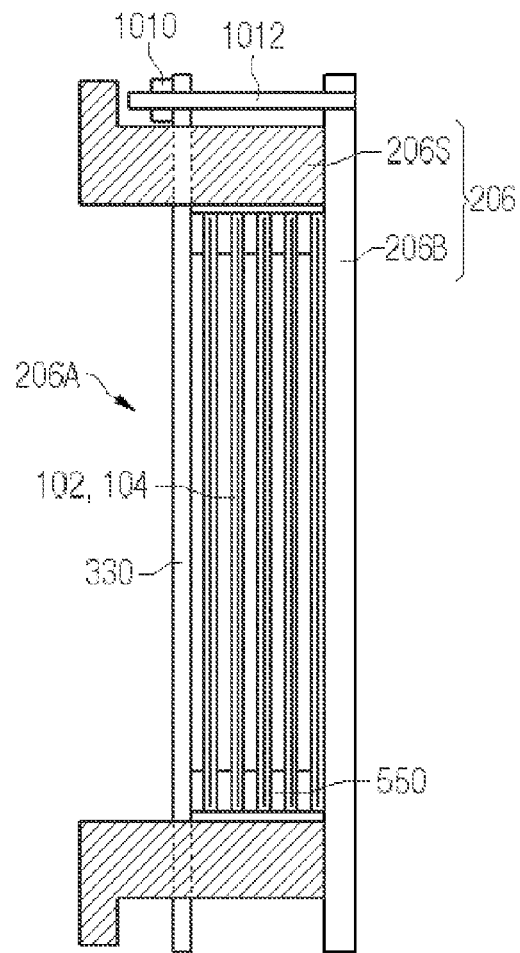
Figure 5A:
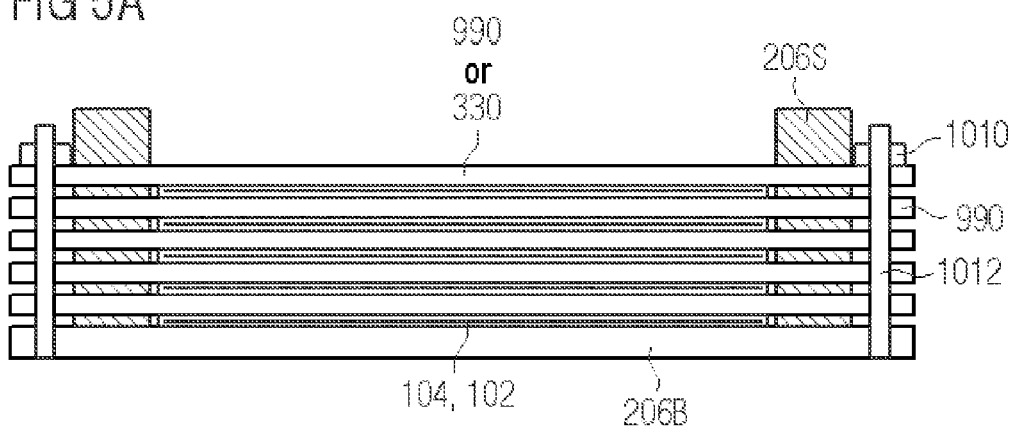
FIGS. 5A and 5B each show a schematic cross-sectional view of a wafer box according to various embodiments.
Figure 5B:
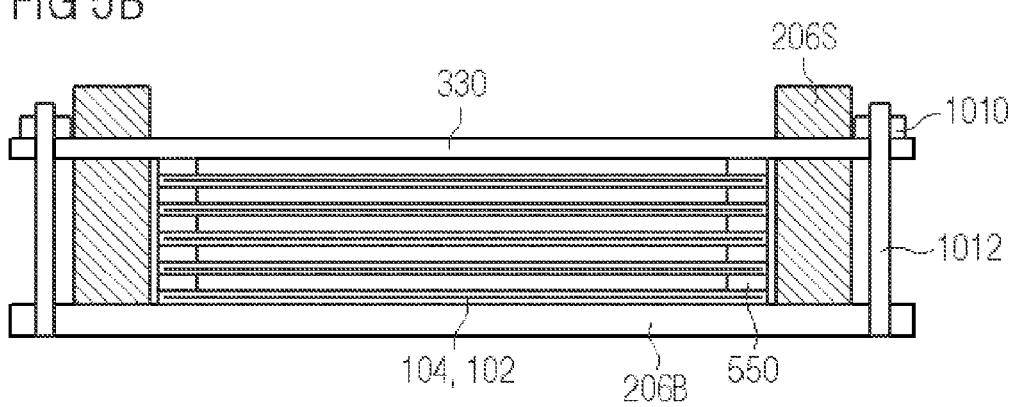

In various embodiments, as illustrated for example in FIG. 3A, FIG. 3B and FIG. 5B, at least one spacer 550 can be utilized which is not provided for being positioned by means of the at least one fixing structure 1012. The at least one spacer 550 may for example be formed as a ring of circular or other shape which is of closed or near-closed form (for example formed along a major part of the circumference of the wafer frame 104, 204). For example, at least one (for example empty) additional wafer carrier (for example wafer frame) 104, 204 may be used as spacer 550.

In various embodiments (not illustrated), the spacers 550 may be omitted. It is then for example possible, for example in embodiments which are similar to those illustrated in FIG. 1A, FIG. 1B, FIG. 3A, FIG. 3B and FIG. 5B, for the wafer carriers (for example wafer frames) 204, 104 (with wafers 102 arranged thereon in each case) to be stacked directly one on top of the other. Also, in various embodiments (not illustrated) which may be similar to those in FIG. 4A, FIG. 4B and/or FIG. 5C, wafer carriers 990 which are used in the embodiments in FIG. 4A, FIG. 4B, FIG. 5A, FIG. 5C and FIG. 6 may be formed in such a way (for example with such a thickness) that the additional spacers 550 can be dispensed with and an aperture 560 (see FIG. 5C) nevertheless remains above the wafer 102.

FIG. 3A, FIG. 3B and FIG. 6 show in each case a schematic cross-sectional view of a wafer box 206, with wafers 102 arranged on wafer carriers 104 or 204, according to various embodiments.

The embodiments illustrated in FIG. 3A, FIG. 3B, FIG. 5A, FIG. 5B and FIG. 6, for example the wafer box 206, the wafer carriers 204 etc., may substantially correspond to the embodiments described above, for example with regard to functionality, materials, dimensions etc.

According to various embodiments, by contrast or in addition to the embodiments described above, it is however possible, in the wafer box 206, for the fixing structure 1012 to be arranged outside the receiving space 206A. The fixing structure 1012 may for example be arranged in a part of a housing base 206B of the wafer box 206 which is not situated below the receiving space 206A.

In various embodiments, the at least one wafer 102 may be fixed in its position by virtue of a closure element 330 being arranged above the at least one wafer 102 (in FIG. 3A and FIG. 3B, above a stack of wafers 102 arranged on for example conventional wafer frames 104) and held in its position by means of the fixing device 1010. The at least one wafer 102 can thus be held fixed in its position directly by means of the closure element 330 and indirectly by means of the fixing device fastened to the fixing structure 1012.

In various embodiments, the at least one closure element 330 may be of flat, for example plate-like form.

In various embodiments, the closure element 330 may extend beyond the side wall 206S of the wafer box 206, for example by means of at least one projection 330V. In the at least one projection 330V there may be formed (in each case) one opening 772 in which the fixing structure 1012 can be received. During the arrangement of the closure element 330 in the wafer box 206, it is thus possible for the fixing structure 1012 to extend through the opening 772.

The closure element 330 may for example be formed from plastic or have a plastic, for example a plastic which is used for wafer carriers, for example wafer frames 104, 204, for example a thermoplastic, for example polypropylene. The closure element 330 may for example be injection-molded.

As illustrated in FIG. 3A, in various embodiments, two or more fixing structures 1012 and two or more fixing devices 1010 may be provided. Angular spacings between the individual fixing structures 1012 may for example be configured as described above for the fixing structures 1012 arranged within the receiving space 206A.

In various embodiments, by contrast or in addition to the embodiments described above, the wafer box 206 may be provided for being arranged vertically, that is to say such that the main surfaces of the wafers 102 are arranged substantially vertically, that is to say parallel to gravitational force, at least temporarily, for example during transport and/or during storage. A removal of the wafers 102 can be performed for example in the vertical position or for example in the horizontal position or in substantially any desired other position.

FIG. 3A, FIG. 3B and FIG. 6 illustrate that, according to various embodiments, the wafer box 206 may be stored, loaded and unloaded such that the stacked wafers 102 are arranged with their main surface substantially vertical, that is to say approximately parallel to gravitational force.

In various embodiments, by contrast or in addition to the other described embodiments, the wafer box 206 may be equipped with projections 206V which permit or facilitate a vertical arrangement on a horizontal underlying surface.

Figure 3C:
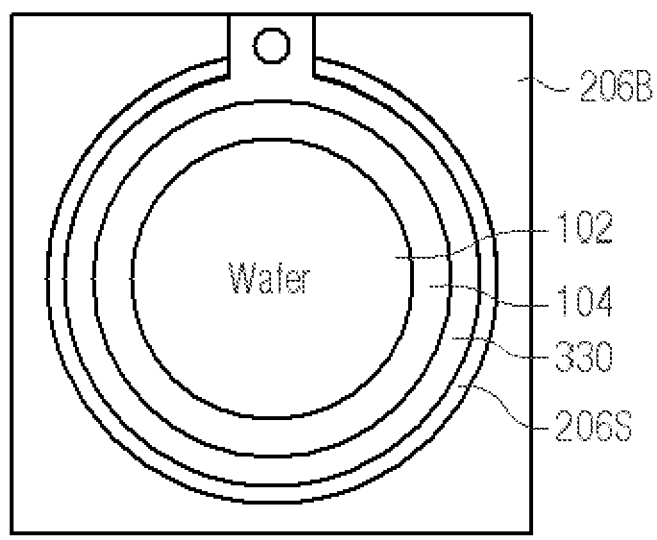
FIG. 3C is a schematic illustration of a wafer box with a wafer arranged on a wafer carrier and with a closure element according to various embodiments.

In various embodiments, a base surface of the wafer box 206 may be square or rectangular (for example as illustrated in FIG. 3C) in order to make it easier or possible for said wafer box to be stood up vertically.

As illustrated in FIG. 3B, it may be sufficient for the wafer box 206 to have only a single fixing structure 1012 with a fixing device 1010, by means of which the closure element 330 is fixed in its position. In various embodiments, the wafer box 206 may in this case be arranged such that, for example during transport or during storage, the fixing structure 1012 is situated on a top side of the wafer box 206, for example on a side of the wafer box 206 averted from a standing surface of the wafer box 206, for example above the receiving space 206A.

In various embodiments, at at least one point at which the closure element 330 can extend from the receiving space 206A beyond the side wall 206S, the side wall 206S may be omitted. This is illustrated in the cross-sectional views in FIG. 3A and FIG. 3B by virtue of the side wall 206S being illustrated with hatching there, because it would not be visible in the cross-sectional views.

Figure 3D:
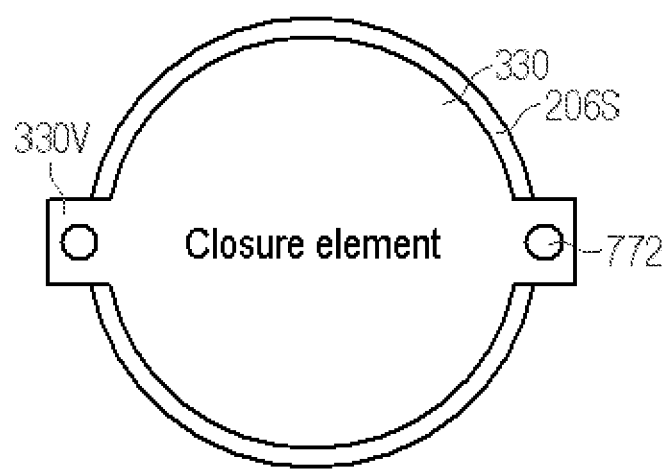
FIG. 3D shows a schematic plan view of a closure element according to various embodiments.

In various embodiments, the closure element 330 may be formed as illustrated in FIG. 3C or FIG. 3D. In FIG. 3C, for improved understanding, in addition to structures that would be visible in a plan view (for example housing base 206B, side wall 206S and closure element 330), it is illustrated where the wafer 102 and the wafer carrier 204 are situated.

Figure 4A:
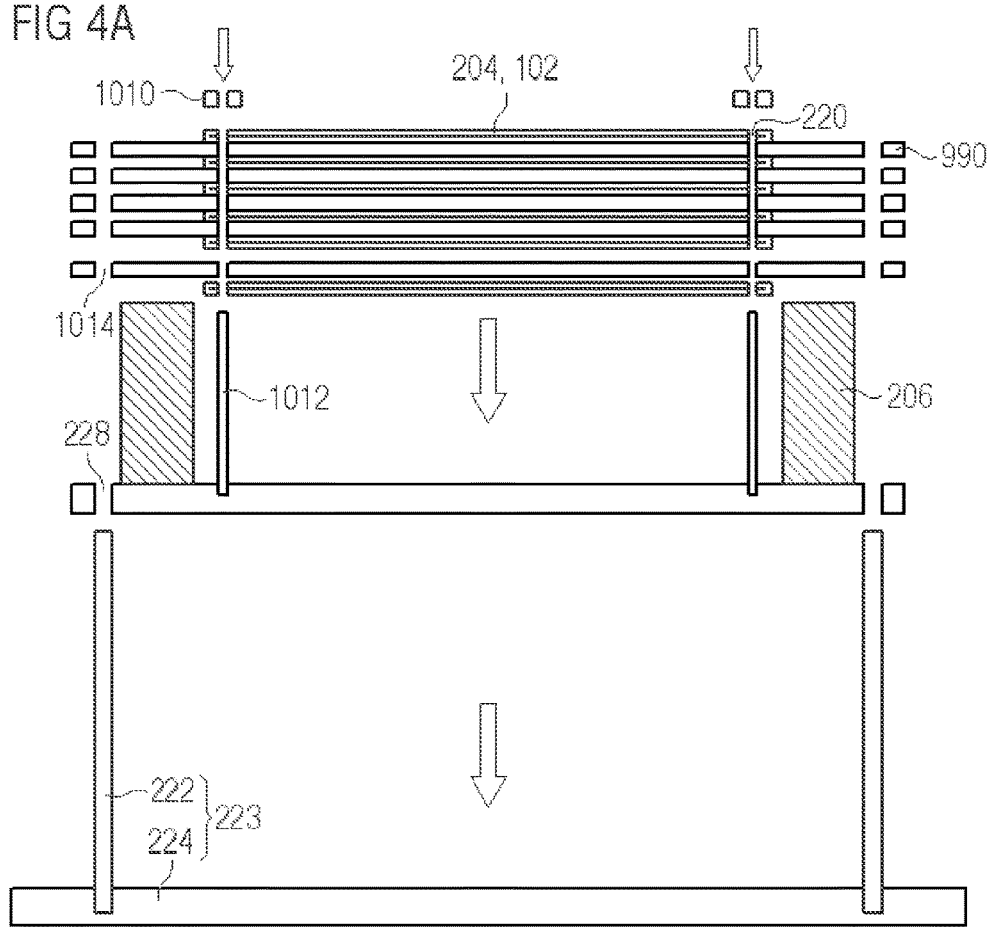
FIGS. 4A and 4B show schematic cross-sectional views for illustrating an arrangement of wafers in a wafer box according to various embodiments.
Figure 4B:
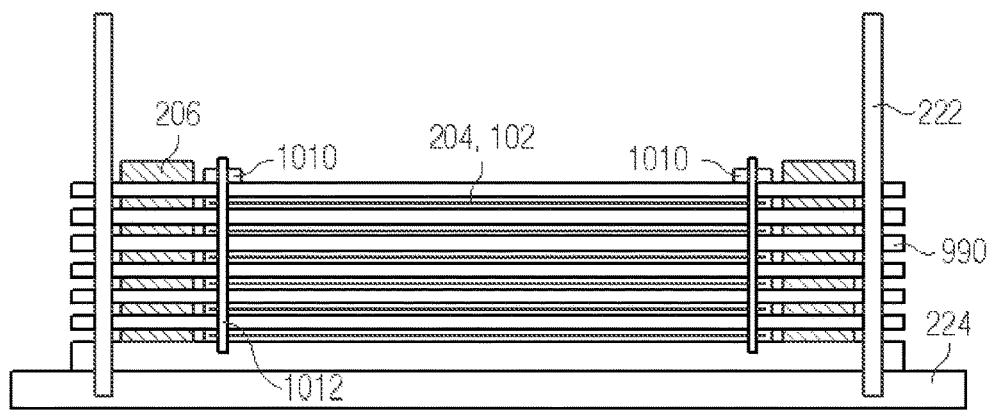

FIG. 4A and FIG. 4B show schematic cross-sectional views for illustrating an arrangement of wafers 102 in a wafer box 206 according to various embodiments.

The embodiments illustrated in FIGS. 4A, 4B, 5A, 5C and 6, for example the wafer box 204, the wafer carriers 206 etc., may substantially correspond to the embodiments described above, for example with regard to functionality, materials, dimensions etc.

By contrast or in addition to the embodiments described above, a wafer carrier 990 may be designed so as to extend at least partially horizontally, that is to say in a plane of the wafer carrier 990, beyond the receiving space 206A, by contrast to the wafer carrier 204, which in terms of its outer dimensions may substantially correspond to a conventional wafer frame.

At least one projection of the wafer carrier 990 may extend as far as beyond the side wall 206S of the housing of the wafer box 206, for example similarly to the situation illustrated for the closure element 330 in FIG. 3C and FIG. 3D. At points at which the at least one projection is to be arranged in the wafer box 206, the side wall 206S may be interrupted. The side wall 206S may for example be omitted there. The side wall 206S is therefore illustrated with hatching in order to illustrate that it would in fact not be visible in the cross section.

In the at least one projection there may be formed in each case one guide opening in which in each case one fixing structure 1012 is arrangeable, that is to say can be arranged.

In this way, in various embodiments, it can be made possible for a wafer 102 arranged on a conventional (unperforated) wafer frame 104, or a wafer 102 which is not mounted on a wafer frame 104, 204, to be arranged on the wafer carrier 990 and fastened by means of the fixing structure 1012 and the fixing device 1010 in a position such that the at least one wafer carrier 990 with the wafer 102 arranged thereon is prevented from undesirably moving in the receiving space 206A of the wafer box 206, which means that the wafer 102 is protected against damage.

In various embodiments, it is possible here for the at least one wafer 102 to be fastened by means of the fixing device 1010 for example by virtue of the at least one wafer carrier 990 being fixed in its position by means of the at least one fixing device 1010, whereby the at least one wafer 102 is in turn fixed in its position.

In various embodiments, the at least one wafer 102, which may be mounted on one of the wafer frames 104 or 204, may be fastened to the at least one wafer carrier 990, and can thus be protected against undesirably moving in the receiving space 206A if the wafer carrier 990 to which the wafer 102 is fastened is fixed in its position.

In various embodiments, the at least one wafer 102, which may be arranged on one of the wafer frames 104 or 204, may be arranged on the at least one wafer carrier 990 such that it can be moved. In such a situation, an uppermost of the at least one wafer 102 may be fixed in its position for example by means of a wafer carrier 990 arranged thereabove (which may for example be empty, that is to say without wafers 102 arranged thereon) or a closure plate 330 arranged thereabove, by virtue of the uppermost (for example empty) wafer carrier 990 or the closure plate 330 being fixed in its position by means of the fixing structure 1012 and the fixing device 1010, and said uppermost wafer carrier or closure plate in turn fixing the wafer frame 104 or 204 with the wafer 102.

In various embodiments, after an arrangement of the wafers 102 in the wafer box 206, the wafer stack may be locked by means of the fixing device 1010, as illustrated by way of example in FIG. 10B. It is thus possible for the wafers 102 arranged on the (additional) wafer carriers 990 and mounted on the wafer carriers (for example wafer frames) 204 to be prevented from inadvertently being removed from, for example falling out of, the wafer box 206.

In various embodiments, a wafer transport system may be provided. The wafer transport system may have a wafer box 206 according to one of the described embodiments, that is to say a wafer box 206 which has at least one fixing structure 1012 and at least one fixing device 1010, and a wafer carrier 204 and/or 990, that is to say at least one wafer carrier which has openings for the fixing structure 1012.

In various embodiments, a stacking aid 223 may furthermore be provided for the arrangement of the wafers 102 in the wafer box 206. The stacking aid 223 may be joined together with the wafer box 206, as illustrated in FIG. 4A and FIG. 4B, such that at least one guide structure 222 (two guide structures 222 by way of example in FIG. 4A and FIG. 4B) extends through the housing base 206B of the wafer box 206. For this purpose, at least one guide structure opening (not illustrated) may be formed in the housing base 206B.

In the various embodiments, at least one (further) guide opening (in addition to the openings for the at least one fixing structure 1012) may be formed in the wafer carrier 990.

The at least one guide structure 222 and the at least one guide opening may be formed so as to be coordinated with one another such that the guide structure(s) 222 together with the guide opening(s) permit guidance during a movement of the wafer 102 in the wafer box 206, for example during a lowering of the wafer during loading of the wafer box 206 with the wafers 102 and/or during a lifting of the wafer during a removal of a wafer 102 from the wafer box 206, in such a way that tilting of the wafer 102 is limited and thus damage to a wafer situated therebelow is prevented.

The openings for the fixing device 1010 and the guide openings for the guide structure 222 may be formed in the wafer carrier 990 such that both the at least one fixing device 1010 and the at least one guide structure 222 can be arranged simultaneously in the wafer carrier 990.

The stacking aid 223 may make it possible for at least one guide structure 222 for the loading and/or unloading of the wafer box 206 to be provided, which at least one guide structure for example projects far beyond an upper edge of the side wall 206S. It can thus be made possible for an insertion of the guide structure 222 into the wafer carrier 990 or a removal of the wafer carrier 990 from the guide structure 222 to be performed outside the receiving space 206A, which can further increase safety against scratching of the wafer 102 arranged therebelow without increasing a transport volume of the wafer box 206, because the stacking aid 223 can be detached from the wafer box 206 again before the wafer box 206 is shipped.

Figure 7A:
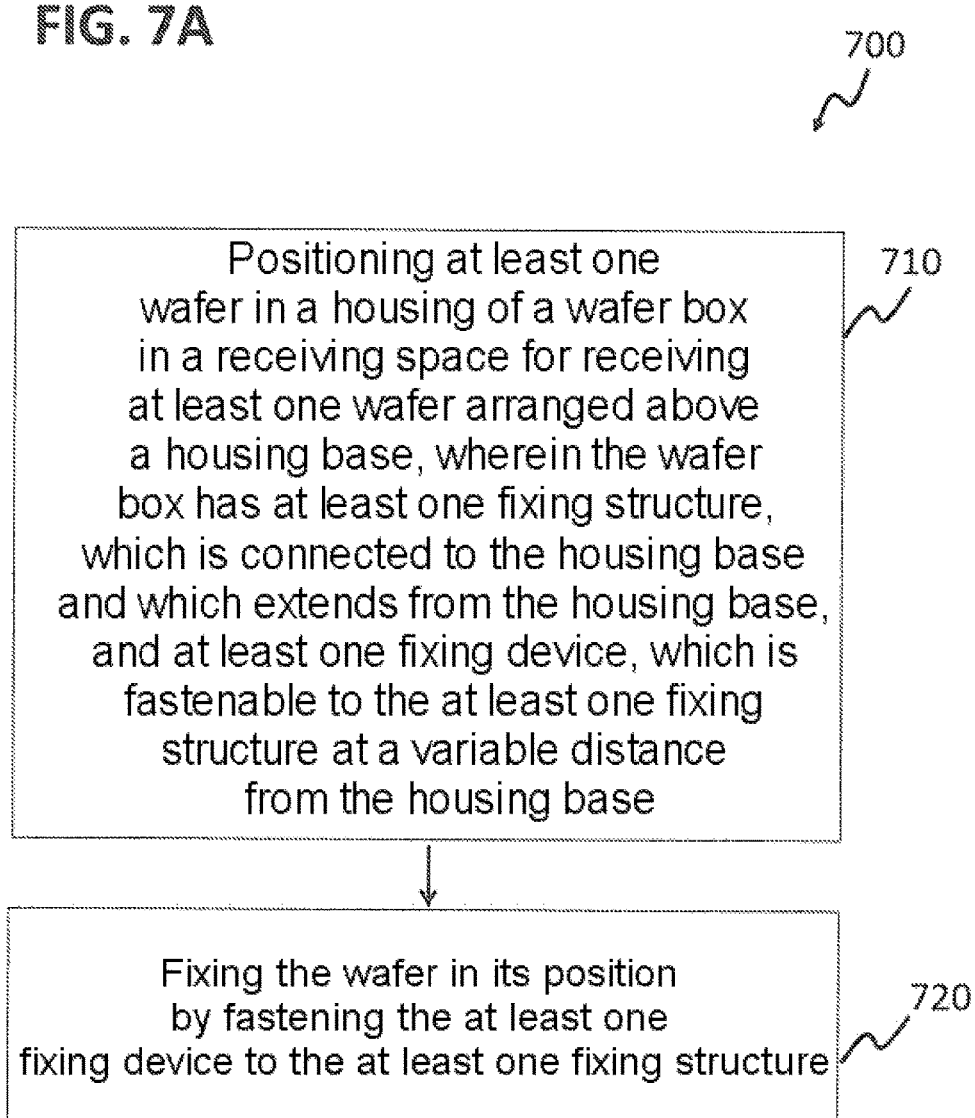

FIG. 7A shows a flow diagram 700 for a method for arranging wafers 102 in a wafer box 206 according to various embodiments.

In various embodiments, the wafer box may have a housing with a receiving space for receiving at least one wafer arranged above a housing base, at least one fixing structure which is connected to the housing base and which extends from the housing base, and at least one fixing device which is fastenable to the at least one fixing structure at a variable distance from the housing base.

In various embodiments, the method for arranging wafers in a wafer box may have a process of positioning at least one wafer in the receiving space (at 701) and a process of fixing the wafer in its position by fastening the at least one fixing device to the at least one fixing structure (at 702).

FIG. 7B shows a flow diagram 701 for a method for arranging wafers 102 in a wafer box 206 according to various embodiments, for example as described with reference to FIG. 1A to 2B.

In various embodiments, the method for arranging wafers in a wafer box may have a process of providing a wafer box having internal fixing structures (at 711), a process of opening the wafer box by removing its cover (at 721), a process of inserting a wafer with guide openings, wherein said wafer, if it is the first inserted wafer, comes to lie on the wafer box base (at 731), and a process of arranging fixing devices on the fixing structures for locking the inserted wafer, for example by pressing on a clamping sleeve and releasing the clamping sleeve when the wafer has been clamped (at 741).

In various embodiments, the insertion of the wafer (731) and the arrangement of the fixing devices (741) may be repeated until a desired degree of filling of the wafer box has been attained.

In various embodiments, the method may thereafter furthermore have a process of closing the wafer box (at 751).

FIG. 7C shows a flow diagram 702 for a method for removing wafers 102 from a wafer box 206 according to various embodiments, for example as described with reference to FIG. 1A to 2B.

In various embodiments, the method for removing wafers from a wafer box may have a process of providing a wafer box having internal fixing structures (at 712), a process of opening the wafer box by removing its cover (at 722), a process of detaching fixing devices for locking the wafer from the fixing structures, for example by pressing on a clamping sleeve and releasing the clamping sleeve when the clamping sleeve has been detached from the fixing structure (at 732), and a process of removing the wafer with guide openings from the wafer box (at 742).

In various embodiments, the detachment of fixing devices (732) and the removal of the wafer (742) may be repeated until a desired number of wafers has been removed.

In various embodiments, the method may thereafter furthermore have a process of closing the wafer box (at 752).

FIG. 7D shows a flow diagram 703 for a method for arranging wafers 102 in a wafer box 206 according to various embodiments, for example as described with reference to FIGS. 3A, 3B, 2A and 2B.

In various embodiments, the method for arranging wafers in a wafer box may have a process of providing a wafer box having external fixing structures (at 713), a process of opening the wafer box by removing its cover (at 723), a process of inserting a wafer (wherein the first wafer can be arranged on the base of the wafer box) (at 733) and a process of inserting a spacer (at 743).

In various embodiments, the insertion of the wafer (733) and the insertion of the spacer (743) may be repeated until a desired loading of the wafer box has been attained.

In various embodiments, the method may subsequently furthermore have a process of closing the wafer box (at 753).

FIG. 7E shows a flow diagram 704 for a method for removing wafers 102 from a wafer box 206 according to various embodiments, for example as described with reference to FIG. 3A, FIG. 3B, FIG. 2A and FIG. 2B.

In various embodiments, the method for removing wafers from a wafer box may have a process of providing a wafer box having external fixing structures (at 714), a process of opening the wafer box by removing its cover (at 724), a process of detaching fixing devices for locking the wafer, for example by pressing on a clamping sleeve and releasing the clamping sleeve when the clamping sleeve has been detached from the fixing structure, and, before removing the first wafer, removing a closure element from the fixing structures (at 734), a process of removing the wafer from the wafer box (at 744) and a process of removing a spacer from the wafer box (at 754).

In various embodiments, the detachment of the fixing devices (734) and the removal of the wafer (744) may be repeated until a desired number of wafers has been removed.

In various embodiments, the method may thereafter furthermore have a process of closing the wafer box (at 764).

Figure 7F:
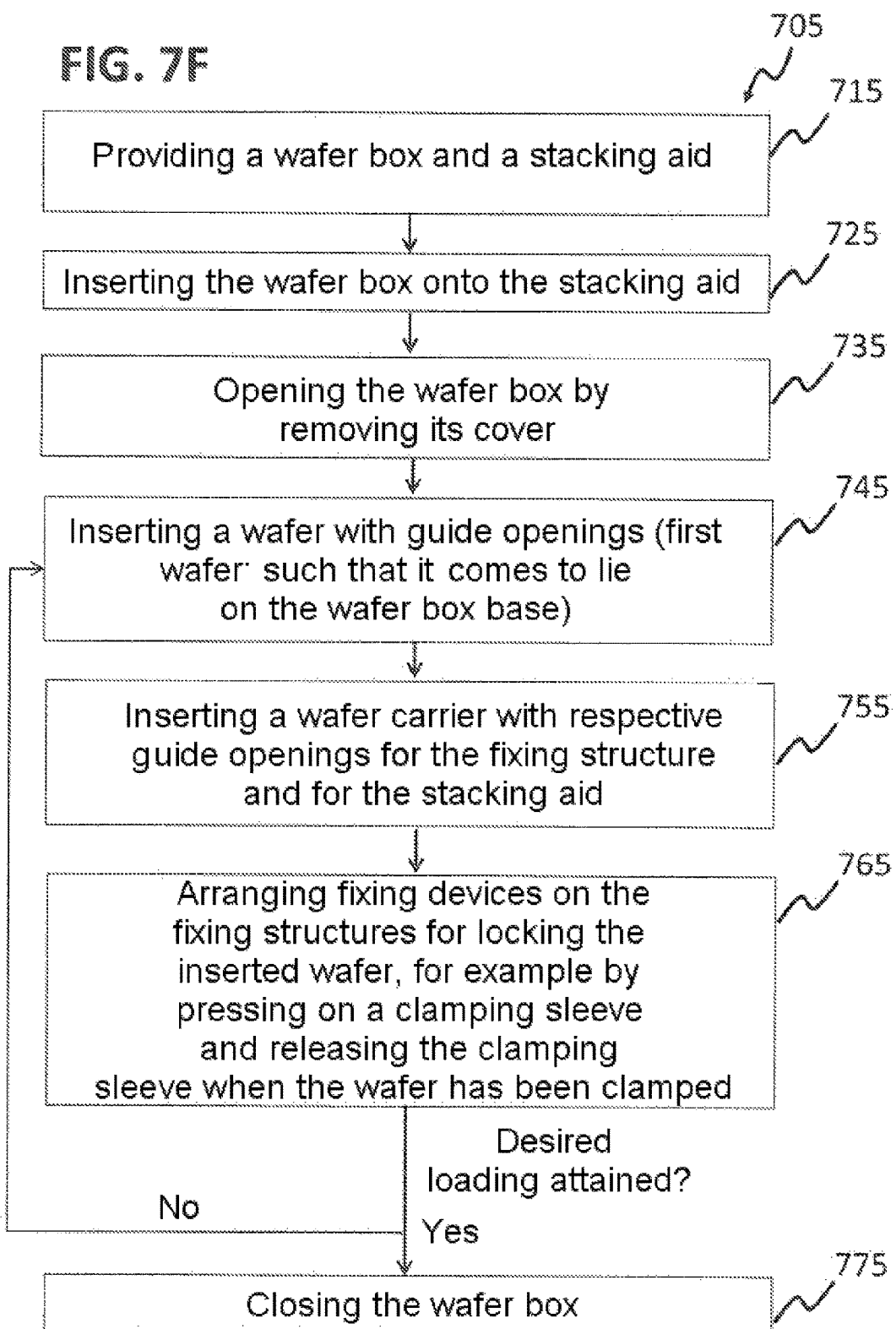
Figure 8A:
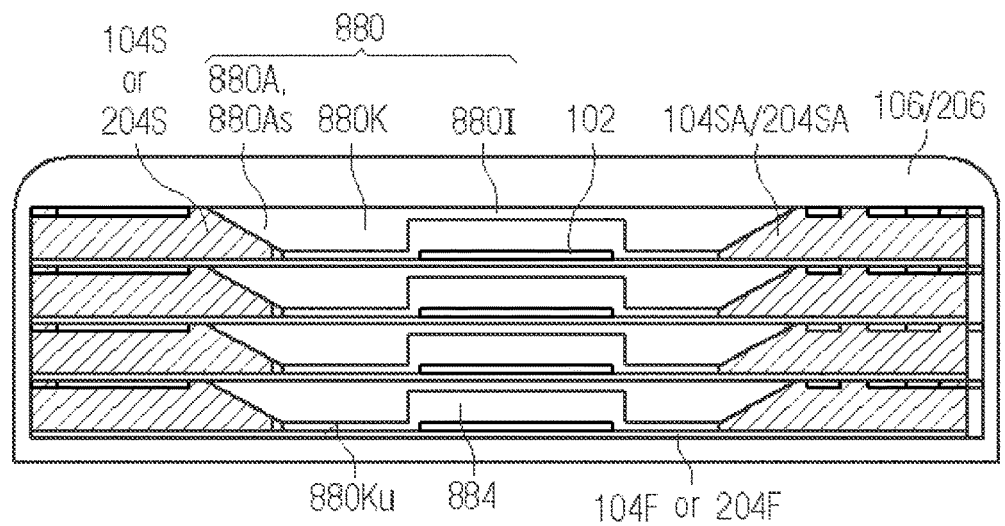
FIGS. 8A to 8H each show a schematic cross-sectional view of a wafer frame with a wafer and with a wafer protection plate according to various embodiments.
Figure 8B:
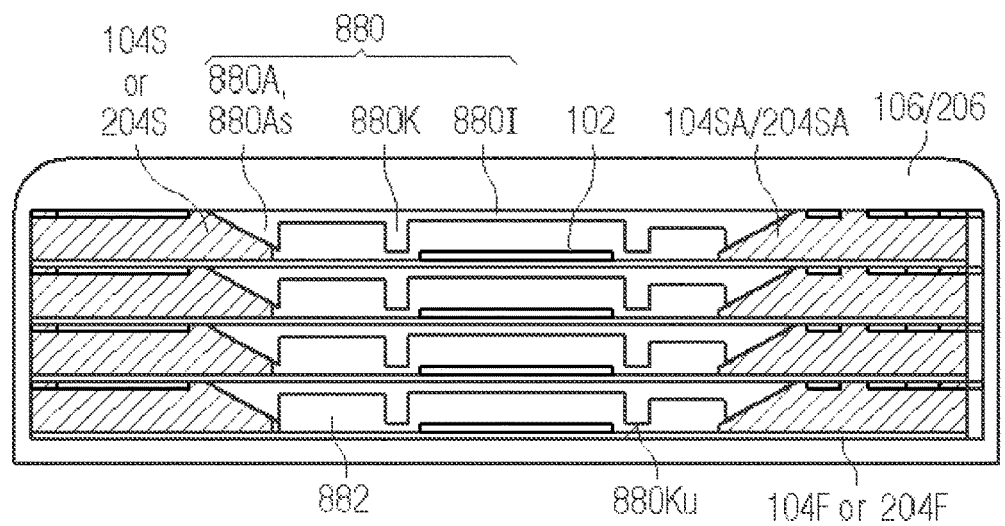
Figure 8C:
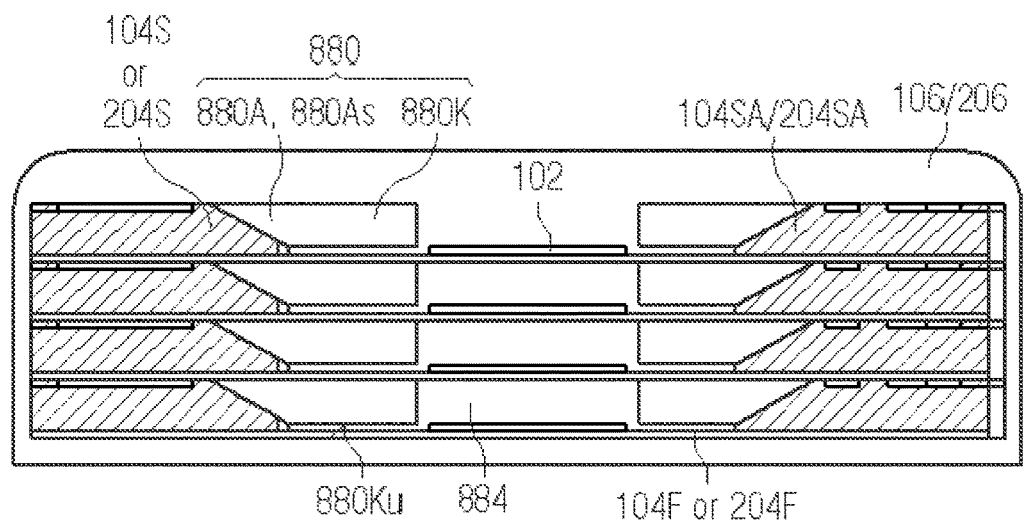
Figure 8D:
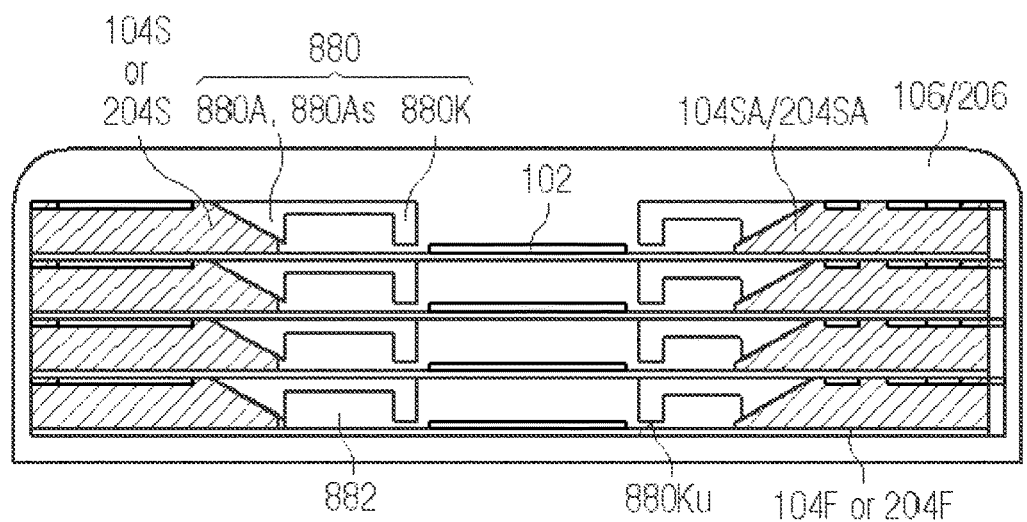
Figure 8E:
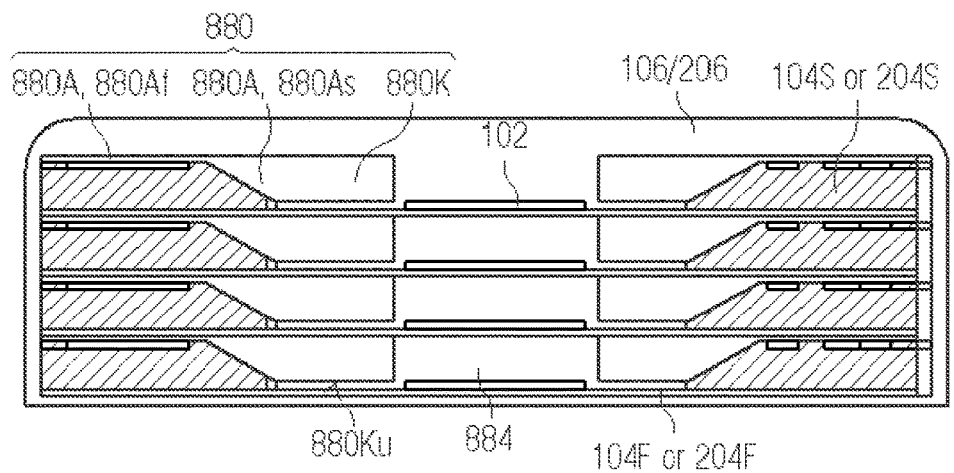
Figure 8F:
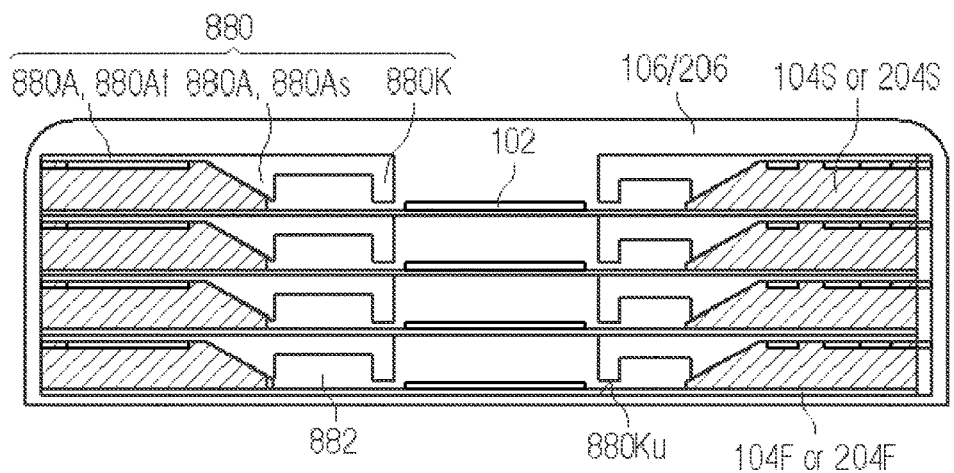
Figure 8G:
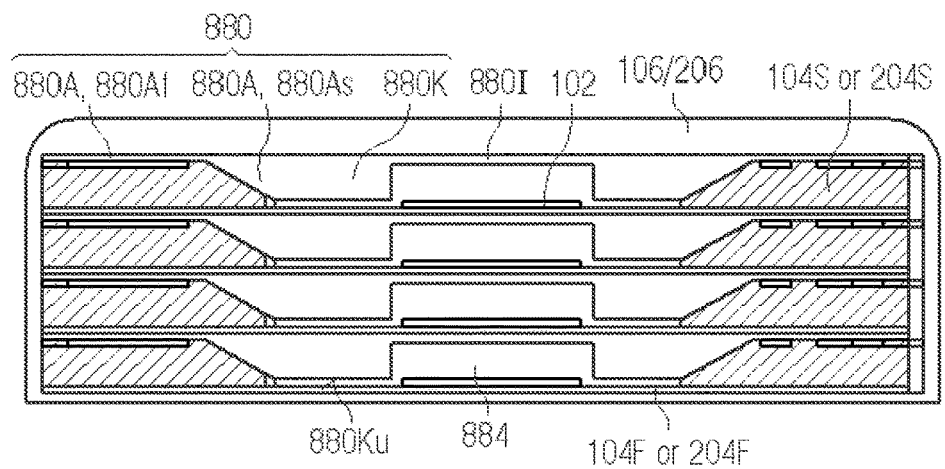
Figure 8H:
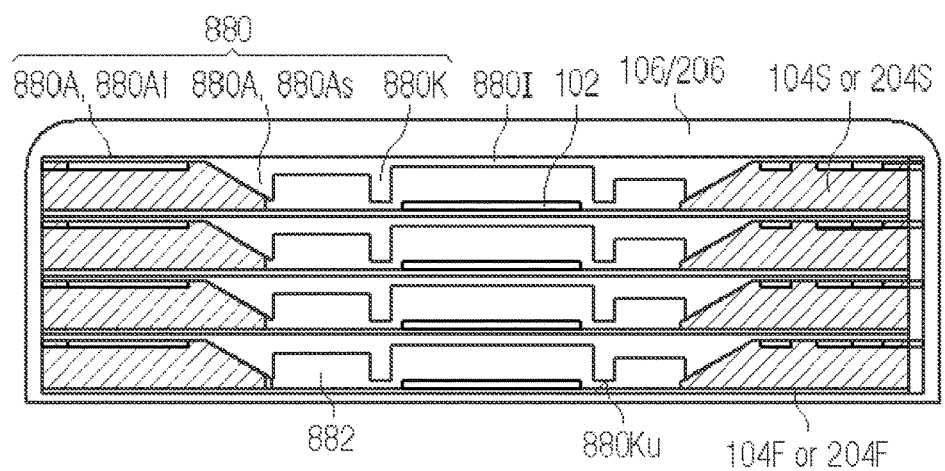

FIG. 7F shows a flow diagram 705 for a method for arranging wafers 102 in a wafer box 206 according to various embodiments, for example as described with reference to FIG. 4A and FIG. 4B.

In various embodiments, the method for arranging wafers in a wafer box may have a process of providing a wafer box and a stacking aid (at 715), a process of inserting the wafer box onto the stacking aid (at 725), a process of opening the wafer box by removing its cover (at 735), a process of inserting a wafer with guide openings such that it comes to lie (if it is the first wafer) on the wafer box base or (if it is a subsequent wafer) on a wafer carrier (at 745), a process of inserting a wafer carrier with respective guide openings for the fixing structure and for the stacking aid (at 755), and a process of arranging fixing devices on the fixing structures for locking the inserted wafer, for example by pressing on a clamping sleeve and releasing the clamping sleeve when the wafer has been clamped (at 765).

In various embodiments, the insertion of the wafer (745), the insertion of the wafer carrier (755) and the arrangement of the fixing devices (765) may be repeated until a desired loading of the wafer box has been attained.

In various embodiments, the method may subsequently furthermore have a process of closing the wafer box (at 775).

FIG. 7G shows a flow diagram 706 for a method for removing wafers 102 from a wafer box 206 according to various embodiments, for example as described with reference to FIG. 4A and FIG. 4B.

In various embodiments, the method for removing wafers from a wafer box may have a process of providing a wafer box laden with wafers and providing a stacking aid (at 716), a process of inserting the wafer box onto the stacking aid (at 726), a process of opening the wafer box by removing its cover (at 736), a process of detaching fixing devices for locking the wafer and a closure element from the fixing structures, for example by pressing on a clamping sleeve and releasing the clamping sleeve when the clamping sleeve has been detached from the fixing structure (at 746), a process of removing the wafer with guide openings from the wafer box (at 756), and a process of removing a wafer carrier with respective guide openings for the fixing structure and for the stacking aid (at 766).

In various embodiments, the detachment of the fixing devices (746), the removal of the wafer (756) and the removal of the wafer carrier (766) are repeated until a desired number of wafers has been removed.

In various embodiments, the method may thereafter furthermore have a process of closing the wafer box (at 776).

Figure 5C:
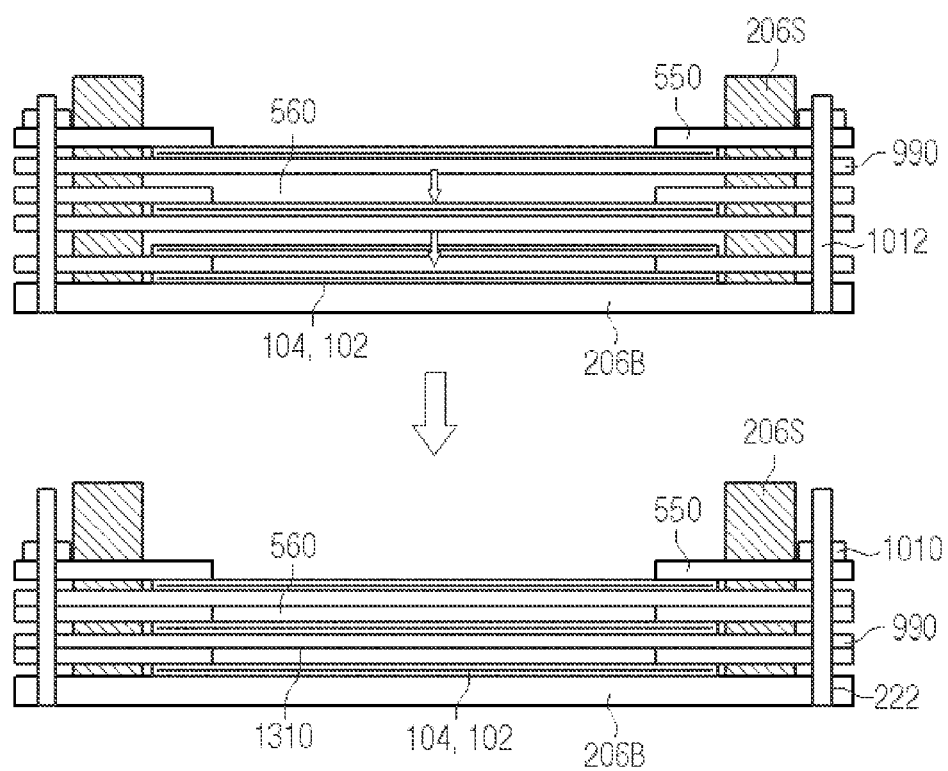
FIG. 5C shows two schematic cross-sectional views for illustrating an arrangement of wafers in a wafer box according to various embodiments.

FIG. 7H shows a flow diagram 705 for a method for arranging wafers 102 in a wafer box 206 according to various embodiments, for example as described with reference to FIG. 5A, FIG. 5B and FIG. 5C.

In various embodiments, the method for arranging wafers in a wafer box may have a process of providing a wafer box having external fixing structures, and providing fixing devices and a spacer or a wafer carrier (at 717), a process of inserting a wafer, wherein the first wafer is inserted onto the base of the wafer box and subsequent wafers are inserted onto wafer carriers (at 727), and a process of inserting a spacer or a wafer carrier (at 737), wherein the wafer carrier may have an opening in the center.

In various embodiments, the insertion of the wafer (727) and the insertion of a spacer or of a wafer carrier (737) may be repeated until a desired loading of the wafer box has been attained.

In various embodiments, the method may subsequently furthermore have a process of placing a fixing device over the uppermost wafer carrier or spacer (at 747).

FIG. 7I shows a flow diagram 708 for a method for removing wafers 102 from a wafer box 206 according to various embodiments, for example as described with reference to FIG. 5A to FIG. 5C.

In various embodiments, the method for removing wafers from a wafer box may have a process of providing a wafer box laden with wafers and having external fixing structures, and providing fixing devices and a spacer or a wafer carrier (at 718), a process of removing a fixing device arranged over the uppermost wafer carrier or spacer (at 728), a process of removing the spacer or the wafer carrier from the wafer box (at 738), and a process of removing the wafer from the wafer box (at 748).

In various embodiments, the removal of the spacer (738) and the removal of the wafer from the wafer box (748) may be repeated until a desired number of wafers has been removed.

Figure 9A:
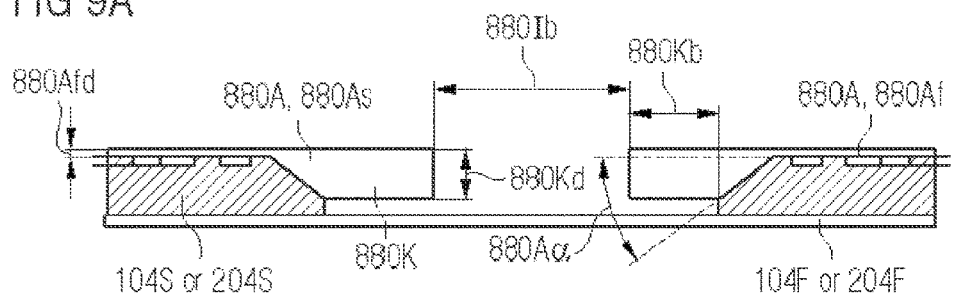
FIGS. 9A to 9C show each show a schematic cross-sectional view of a wafer frame with a wafer and with a wafer protection plate according to various embodiments.
Figure 9B:
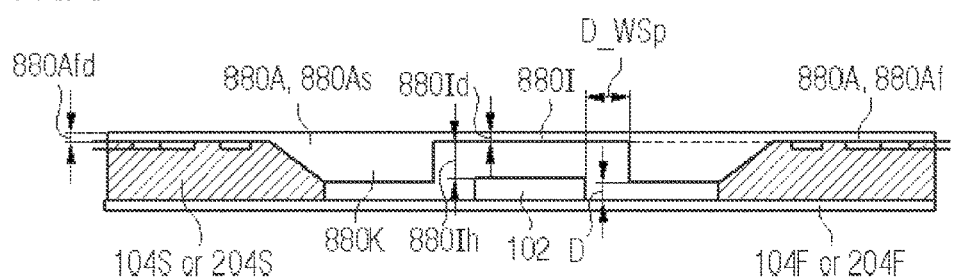
Figure 9C:
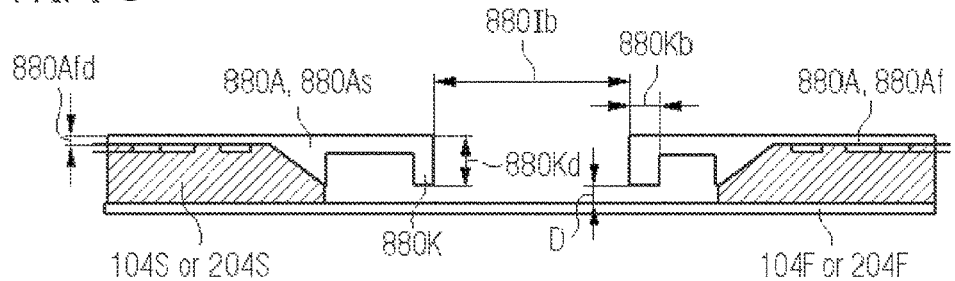

FIG. 8A to FIG. 8H show in each case a schematic cross-sectional view of a wafer frame 104 or 204 with a wafer 102 and with a wafer protection plate 880 according to various embodiments. FIG. 9A to FIG. 9C show in each case a schematic cross-sectional view of a wafer frame 104 or 204 with a wafer 102 and with a wafer protection plate 880 according to various embodiments.

Reference designations for various spacings, thicknesses, widths etc. are specified in FIG. 9A to FIG. 9C. For this purpose, three of the embodiments illustrated in FIG. 8A to FIG. 8H have been selected by way of example, and for the sake of clarity, not all of the dimensions have been illustrated in all three FIG. 9A, FIG. 9B, FIG. 9C. It is to be understood that the dimensions and reference designations apply equally to similar components, spacings etc. of the other embodiments illustrated in FIG. 8A to FIG. 8H and possibly in other embodiments.

The wafer frame may for example have a conventional wafer frame 104 as described in conjunction with the embodiments above, or may have a wafer frame 204 according to embodiments above (that is to say for example a wafer frame 204 with openings in a frame region), wherein the wafer frame 104 or 204 (hereinafter referred to as wafer frame 104/204) has a rigid or substantially rigid frame region 104S or 204S (hereinafter 104S/204S) and, connected thereto, an elastic carrier film 104F or 204F (hereinafter 104F/204F), for example a sawing film, on which the wafer 102 can be arranged. In various embodiments, the wafer carrier 104/204 may have another wafer frame which has the rigid frame region and the elastic film.

In various embodiments, the wafer frame 104/204 may have a top side and a bottom side situated opposite the top side, wherein the wafer frame 104/204 is designed such that the wafer 102 can be arranged on the top side on the carrier film 104F/204F.

In various embodiments, the rigid frame region 104S/204S of the wafer frame 104/204 may be formed with an inner edge which slopes downward obliquely to a wafer region. In other words, an edge, facing toward the wafer 102, of the rigid frame region 104S/204S may be designed such that a spacing between mutually oppositely situated points of the inner edge of the rigid frame region 104S/204S becomes greater with increasing distance from the carrier film 104F/204F.

In various embodiments, the wafer protection plate 880 for protecting at least one wafer 102 arranged on a wafer frame 104/204 with elastic carrier film 104F/204F may have a support region 880A for support on the rigid region 104S/204S of the wafer frame 104/204.

In various embodiments, the wafer protection plate 880 may furthermore have an inner region 880I. The inner region 880I may be situated within the support region 880A, that is to say closer to a center of the wafer protection plate 880 and/or so as to encompass the center of the wafer protection plate 880.

In various embodiments, the wafer protection plate 880 may furthermore have a contact region 880K between the inner region 880I and the support region 880A.

In various embodiments, the wafer protection plate 880 may be designed and arranged on the top side of the wafer frame 104/204 such that, when the support region 880A is in a supported state (on the wafer frame 104/204), the inner region 880I is arranged over the wafer 102 and the contact region 880K extends in the direction of the carrier film 104F/204F to such an extent that, in the event of contact between the carrier film 104F/204F and the contact region 880K, the top side of the wafer 102 is not in contact with the wafer protection plate 880.

In various embodiments, a spacing D between a bottom side 880Ku of the contact region 880K, for example a surface of the contact region 880K facing toward the carrier film 104F/204F, and a top side of the carrier film 104F/204F may be smaller than a spacing 880Th between a top side (facing toward the wafer protection plate 880) of the wafer 102 and a bottom side, facing toward the wafer 102, of the inner region 880I of the wafer protection plate 880.

In various embodiments, the wafer protection plate 880 may be designed such that the inner region 880I is free from (for example solid) material. In other words, the inner region may be designed such that only ambient air, another gas or a vacuum is situated there.

In various embodiments, a vibration of the carrier film 104F/204F with the wafer 102, which may be a sawn or unsawn wafer 102, arranged thereon, which vibration is caused for example by movements of the wafer box and/or of the wafer, can be limited. For example, a deflection of the wafer 102 can be limited by means of the contact region 880K, which in the case of a moving wafer 102 can be in or come into contact with the carrier film 104F/204F, such that the wafer 102 cannot strike an inner surface of the inner region 880I and/or a wafer frame 104/204 arranged thereabove.

In various embodiments, damage to edges of the separated chips can be avoided or reduced through restriction of an amplitude with which the chip 102 mounted on the carrier film 104F/204F is deflected.

In various embodiments, the contact region 880K may be arranged so close to the carrier film 104F/204F, and at the same time a height of a free space 884 above the wafer 102 may be so large, that even if the carrier film 104F/204F is caused to vibrate and, for limitation of the amplitude of the vibration, comes into contact with the contact region 880K, a part of the free space above the wafer 102 remains. In various embodiments, the height of the free space 884 above the wafer 102 may be limited by a bottom side of a further wafer frame 104/204 which is arranged above the wafer frame 104/204 with the wafer 102 and the wafer protection plate 880.

In various embodiments, it is possible, as illustrated in FIG. 8A to FIG. 8H and in FIG. 9A to FIG. 9C, for the spacing D (vertically, that is to say measured perpendicularly to the carrier film 104F/204F) between the contact region 880K and the carrier film 104F/204F to be less than 2 mm, for example less than 1 mm, for example approximately 0.8 mm or less. In various embodiments, the spacing D may amount to zero millimeters, that is to say the carrier film 104F/204F may be in contact with the contact region 880K, for example with a bottom side 880Ku of the contact region 880K, even in a rest state, for example when a wafer frame 104/204 is not moved and/or in the case of a wafer frame 104/204 in which the elastic carrier film 104F/204F is not deflected out of a rest position (also referred to as origin position).

In various embodiments, the spacing 880Ih between the top side of the wafer 102 and a bottom side, facing toward the wafer 102, of the inner region 880I may lie in a range from approximately 1 mm to approximately 3 mm, for example may be around approximately 2.4 mm.

In various embodiments, it is possible, as illustrated in FIG. 8A, FIG. 8C, FIG. 8E, FIG. 8G, FIG. 9A and FIG. 9B, for the contact region to extend substantially from the inner edge of the rigid frame part 104S/204S of the wafer frame 104/204 as far as the wafer 102 or almost as far as the wafer 102, for example as far as a horizontal distance D_WSp of approximately 3 mm or less from the wafer 102.

In various embodiments, the inner region 880I may have a width 880Ib in a range from one wafer width to approximately 6 mm more than the wafer width, that is to say, for a (for example circular) standard wafer in 6 inch format, the inner region may have a diameter between approximately 150 mm and approximately 156 mm, in 8 inch format, between approximately 200 mm approximately 206 mm, in 12 inch format, between approximately 300 mm and approximately 306 mm, and in 18 inch format, between approximately 450 mm and approximately 456 mm. A corresponding situation may apply for example for the wafer protection plate 880 for non-circular wafers 102, for example for square solar cell wafers 102. In the case of a wafer 102 with a side length of 125 mm×125 mm, the square inner region 880I may have a width 880Ib between approximately 125 mm and approximately 131 mm.

In various embodiments, the width 880Ib of the inner region 880I may be selected, for example with the dimensions described above, such that, even in the case of manufacturing tolerances of wafer frame 104/204 and/or of the wafer protection plate 880 and/or positioning tolerances of the wafer 102 on the wafer frame 104/204 and/or positioning tolerances of the wafer protection plate 880 on the wafer frame 104/204, in the event of a (direct or indirect) movement of the wafer frame 104/204, which can lead for example to a reduced vibration of the carrier film 104F/204F, contact between the wafer 102 and the wafer protection plate 880 is prevented.

In various embodiments, the contact region 880K may directly adjoin the inner region 880I. In various embodiments, a further region (not illustrated) may be arranged between the inner region 880I and the contact region 880K.

In various embodiments, it is possible, as illustrated in FIG. 8B, FIG. 8D, FIG. 8F, FIG. 8H and FIG. 9C, for an aperture 882 to be arranged between the contact region 880K and the support region 880A. The aperture 882 may extend into the wafer protection plate 880 proceeding from a bottom side of the wafer protection plate 880. The contact region 880K can be reduced in size by means of the aperture 882. In various embodiments, the contact region 880K may be arranged in a region, situated closest to the wafer 102, of the wafer protection plate 880. In various embodiments, the region, situated closest to the wafer 102, of the wafer protection plate 880 may make the greatest contribution to limiting the vibration of the carrier film 104F/204F in relation to contact regions arranged further remote from the wafer 102. Thus, a functionality of the wafer protection plate 880 (vibration damping, limitation of a movement of the carrier film 104F/204F in an upward direction) can be maintained substantially unchanged, whereas for example a weight of the wafer protection plate 880 and a material requirement during production of the wafer protection plate 880 can be reduced.

In various embodiments, the contact region 880K may have a width 880Kb perpendicular to a margin of the wafer 102 in a range from approximately 2 mm to approximately 40 mm, for example from approximately 2 mm to approximately 20 mm, for example of approximately 10 mm.

In various embodiments, the contact region 880K may have a length along the margin of the wafer 102 in a range from approximately 1 cm to one full circumference, for example from approximately 2 cm to approximately 30 cm, for example from approximately 10 cm to approximately 20 cm.

In various embodiments, the inner region 880I, the contact region 880K and the support region 880A may be formed as closed ring-shaped concentric regions, for example (for circular standard wafers 102) as circular regions, or as regions with some other ring shape, for example (for standard solar cell wafers 102) as square or rectangular rings.

In various embodiments, if the inner region 880I, the contact region 880K and/or the support region 880A are/is not formed as (a) complete ring(s) but at least one of the regions is formed as a multiplicity of segments, the multiplicity of segments may be distributed uniformly, that is to say with uniform angular spacings between the segments, over the respective region. Here, a length and a number of the segments may be selected such that the functionality of the respective region is maintained. For example, the segments of the contact region 880K may be formed such that contact between the wafer 102 and the wafer protection plate 880 is prevented, for example through limitation of the vibration of the carrier film 104F/204F.

In various embodiments, as illustrated in FIG. 8A, FIG. 8B, FIG. 8G, FIG. 8H and FIG. 9B, the wafer protection plate 880 may have, in the inner region 880I, at least one layer of a rigid material, for example of a material from which the entire wafer protection plate 880 can be manufactured, for example plastic, for example a thermoplastic, for example polycarbonate. In various embodiments, the wafer protection plate 880 may have a metal or a combination of various metals.

In various embodiments, the wafer protection plate 880 may have materials which can be cleaned, such that, after use and after a cleaning process, the wafer protection plate 880 can be reused.

In various embodiments, the wafer protection plate 880 may be produced by means of injection molding.

In various embodiments, a thickness 880Id of the wafer protection plate 880 in the inner region 880I may lie in a range from approximately 0.5 mm to approximately 2 mm, and may for example be approximately 1.5 mm.

In various embodiments, the wafer protection plate 880 equipped with the layer of rigid material in the inner region 880I may provide additional protection for the wafer 102 against contamination and/or contact.

In various embodiments, it is possible, as illustrated in FIG. 8A, FIG. 8B, FIG. 8G, FIG. 8H and FIG. 9B, for the layer of rigid material in the inner region 880I to be formed such that the top side, averted from the wafer frame 104/204, of the wafer protection plate 880 has a planar or substantially planar surface. In various embodiments, the top side of the wafer protection plate 880 may extend in a direction away from the carrier film 104F/204F at most as far as an uppermost surface of the top side of the wafer frame 104/204. Here, the wafer protection plate 880 and the uppermost surface of the top side of the wafer frame 104/204 may together form a planar or substantially planar surface.

In various embodiments, the top side of the wafer protection plate 880 may, in the case of a vertical stack of a multiplicity of wafers 102 arranged on wafer frames 104/204 equipped with wafer protection plates 880, serve as carrier surface for the wafer frame 104/204 arranged in each case thereabove. The layer of rigid material in the inner region 880I can in this case prevent a deflection of the carrier film 104F/204F of the upper wafer frame 104/204 downward, that is to say to the wafer 102 arranged therebelow.

In various embodiments, it is possible, as illustrated in FIG. 8C, FIG. 8D, FIG. 8E, FIG. 8F, FIG. 9A and FIG. 9C, for the wafer protection plate to be free from material in the inner region. Thus it is possible for a height of the free space 884 above the wafer 102 to be maximized.

In various embodiments, a thickness of the contact region 880Kd may be configured such that, even in the case of a vertical stack of a multiplicity of wafers 102 arranged on wafer frames 104/204 equipped with wafer protection plates 880, in the event of a deflection of the carrier film 104F/204F of the upper wafer frame 104/204 downward, that is to say to the wafer 102 arranged therebelow, a bottom side of the upper carrier film 104F/204F does not come into contact with a top side of the wafer 102 arranged therebelow.

In other words, a top side, facing toward the upper wafer frame 104/204, of the contact region 880K may be formed, for example as part of a planar upper surface of the overall wafer protection plate 880, which in various embodiments may form a planar surface with an upper surface at least of one part of the wafer frame 104/204, or for example as an upper contact region which can make contact with the carrier film 104F/204F arranged above the wafer protection plate 880, such that a vibration of the upper carrier film 104F/204F downward can be limited or prevented such that the bottom side of the upper carrier film 104F/204F does not come into contact with the top side of the wafer 102 arranged therebelow.

In various embodiments, the thickness 880Kd of the contact region 880K may lie between approximately 1.5 mm and approximately 5 mm, for example between approximately 1.8 mm and approximately 4 mm.

In various embodiments, the wafer carrier 104/204 may, as may be the case for example in conventional wafer carriers 104, have a beveled part 104SA/204SA at its rigid region 104R/204R. A surface of the beveled part 104SA/204SA may face toward an inner region of the wafer frame 104/204. For example, the beveled part 104SA/204SA may be formed such that its surface is situated closer to the carrier film 104F/204F at the inner edge of the rigid region 104R/204R than further to the outside on the beveled part. An angle between the carrier film 104F/204F and the beveled part 104SA/204SA may for example amount to between approximately 10° and approximately 50°, for example approximately 30°.

In various embodiments, as illustrated in FIG. 8A to FIG. 8H and FIG. 9A to FIG. 9C, the support region 880A may be designed at least partially, for example in an oblique part 880As of the support region 880A, so as to have a surface which is inclined relative to a plane of the wafer protection plate 880 and which is in contact, or can be placed in contact, with the beveled part 104SA/204SA of the rigid region 104S/204S of the wafer frame 104/204.

In various embodiments, the inclined surface of the wafer protection plate 880 and the beveled part 104SA/204SA may be substantially parallel to one another. In various embodiments, an angle α between the (horizontal) plane of the wafer protection plate 880 and the inclined surface of the oblique part 880As of the support region 880A may be exactly equal to the angle between the carrier film 104F/204F and the beveled part 104SA/204SA, for example between approximately 10° and 50°, for example approximately 30°.

In various embodiments, by means of the oblique part of the support region 880A, which with regard to its angle α may be coordinated with the angle of the beveled part 104SA/204SA, it is possible to achieve a high degree of centering accuracy and thus a high degree of positioning accuracy for the arrangement of the wafer protection plate 880 on the wafer frame 104/204, such that it can be ensured that the inner region 880I of the arranged wafer protection plate 880 is situated above the wafer 102, and the contact region 880K is situated above, for example on, the carrier film 104F/204F. Here, a high degree of positioning accuracy may be understood to mean that a sum total of a positioning tolerance of the wafer protection plate 880 on the wafer frame 104/204 and of a positioning tolerance of the wafer 102 in the wafer frame 104/204 of at most approximately 3 mm can be achieved.

In various embodiments, a high degree of positioning accuracy for the arrangement of the wafer protection plate 880 on the wafer frame 104/204 can be ensured in some other way, for example during the arrangement of the at least one wafer frame 104/204 in a wafer box 106/206.

Here, in various embodiments, the side wall of the wafer box 106/206 may be designed so as to permit sufficiently accurate positioning of the wafer frame 104/204 and of the wafer protection plate 880. In various embodiments, if the wafer frames 204 equipped with openings for receiving the above-described fixing structure 1012 are used, the wafer protection plate 880 may also be equipped with openings for the at least one fixing structure 1012 (not illustrated), and the at least one wafer frame 204 and the wafer protection plate 880 can be positioned with sufficient accuracy by means of the fixing structure and the openings if a clearance of the openings with respect to the fixing structure 1012 is small enough.

In various embodiments, the support region 880A may be in contact with an uppermost surface of a top side, which is averted from the carrier film, of the wafer frame 104/204. This may also be referred to as flat part 880Af of the support region 880A.

In various embodiments, as illustrated for example in FIG. 8E to FIG. 8H and FIG. 9A to FIG. 9C, the flat part 880Af may be provided in addition to the oblique part 880As of the support region 880A. In that case, the flat part 880Af of the support region may for example increase a spacing between the wafer frame 104/204 and the further wafer frame 104/204 possibly arranged thereabove, and at the same time provide a planar surface on the top side of the wafer protection plate 880. In various embodiments, in which the inner region 880I is free from material, it is thus possible for the spacing between the surface of the lower wafer 102 and the carrier film 104F/204F of the upper wafer frame 104/204 to be enlarged.

In various embodiments, in the case of a predefined spacing 880Ih between the top side of the wafer 102 and the bottom side of the inner region 880I of the wafer protection plate 880, it can be made possible by means of the flat part 880Af of the support region for the layer of rigid material to be formed with a sufficient thickness 880Id and, at the same time, for a planar surface to be provided on the top side of the wafer protection plate 880. This may be advantageous for example when using thin wafer frames 104/204 and/or in the case of large-area (and thus relatively heavy) wafers 102 and wafer frames 104/204.

In various embodiments, for example if the positioning accuracy is ensured in some other way, the support region 880A of the wafer protection plate 880 may be formed as the flat part 880Af of the support region 880A without the oblique part 880As of the support region 880A.

In various embodiments, a combination of the wafer frame 104/204, on which the wafer 102 can be arranged, and of the wafer protection plate 880 may form a wafer transport system.

In various embodiments, the wafer transport system may furthermore have a conventional, for example already commercially available, wafer box 106 or a wafer box 206 according to one of the embodiments described above (denoted in the figures as "106/206").

In various embodiments, the transport system may permit cost-effective and transport-volume-optimized (for example horizontal) transport of the wafers 102 mounted on the wafer frames 104/204, wherein the wafers may be separated or unseparated and may possibly have a very sensitive surface.

Figure 10A:
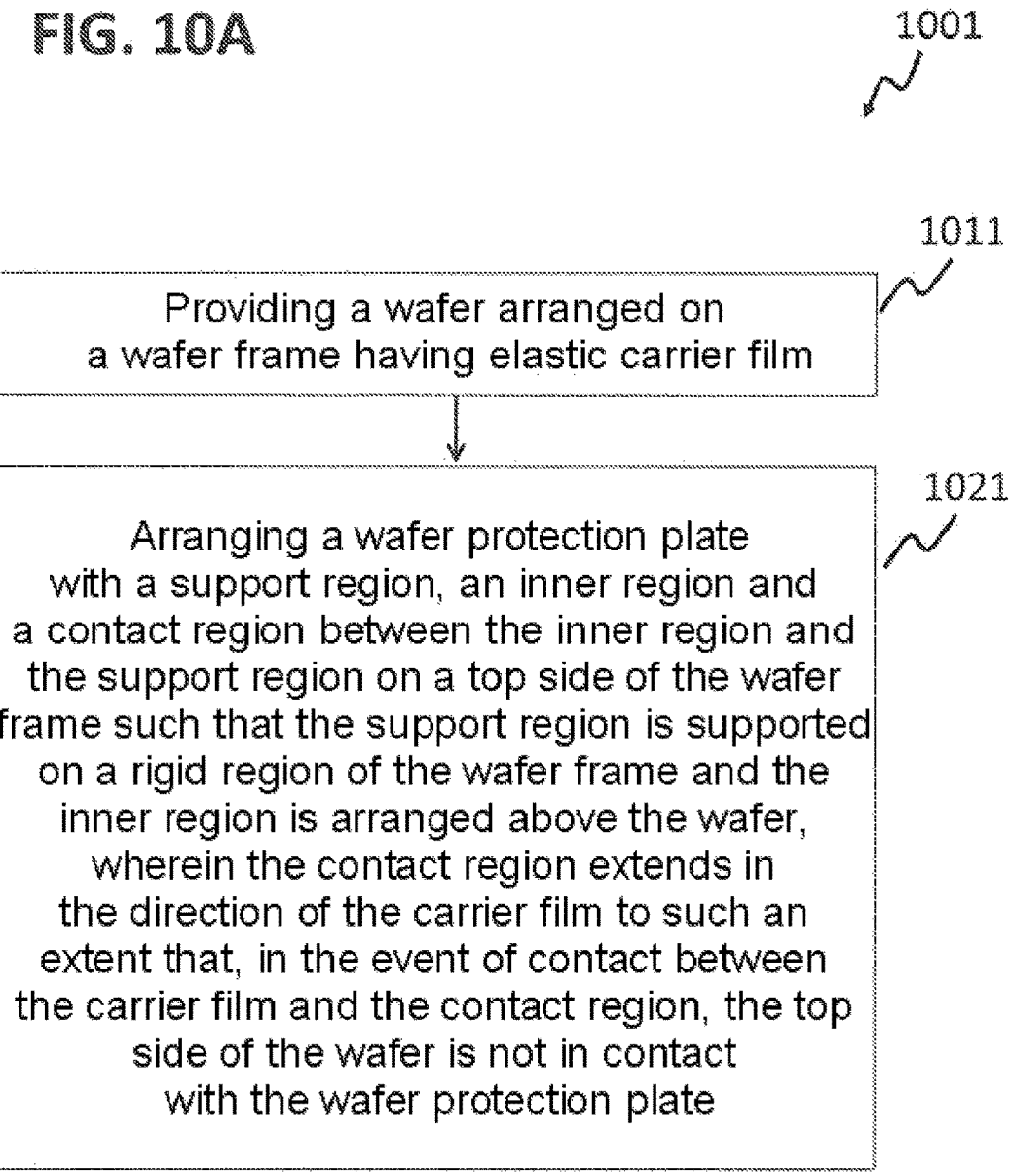
FIG. 10A a flow diagram for a method for protecting at least one wafer according to various embodiments.

FIG. 10A shows a flow diagram 1001 for a method for predicting at least one wafer according to various embodiments.

In various embodiments, the method may have a process of providing a wafer arranged on a wafer frame having elastic carrier film (at 1011), and a process of arranging a wafer protection plate with a support region, an inner region and a contact region between the inner region and the support region on a top side of the wafer frame such that the support region is supported on a rigid region of the wafer frame and the inner region is arranged above the wafer, wherein the contact region extends in the direction of the carrier film to such an extent that, in the event of contact between the carrier film and the contact region, the top side of the wafer is not in contact with the wafer protection plate (at 1021).

In various embodiments, the method may furthermore have a process of arranging the wafer frame in a wafer box. The arrangement of the wafer protection plate may then involve an arrangement of the wafer protection plate in the wafer box.

In various embodiments of the method, a multiplicity of wafers arranged on wafer frames may be arranged in vertically stacked fashion in the wafer box. Accordingly, the method may furthermore have the process s of, after the arrangement of the wafer frame and of the wafer protection plate, arranging at least one further wafer frame, and arranging a further wafer protection plate.

In various embodiments, the processes performed on the wafers, for example the arrangement of the wafer frame in the wafer box and/or a removal from the wafer box, may be possible in standard machines.

FIG. 10B shows a flow diagram 1102 for a method for arranging wafers in protected fashion in a wafer box according to various embodiments, for example as described with reference to FIG. 8.

In various embodiments, the method for arranging wafers in protected fashion in a wafer box may have a process of providing a wafer box (at 1112), a process of opening the wafer box by removing its cover (at 1122), a process of inserting a wafer arranged on a wafer frame with elastic carrier film (at 1132), and a process of inserting a wafer protection plate with free space above the wafer (at 1142).

In various embodiments, the insertion of the wafer (1132) and the insertion of the wafer protection plate (1142) may be repeated until a desired degree of filling of the wafer box has been attained.

In various embodiments, the method may thereafter furthermore have a process of closing the wafer box (at 1162) and, if the wafer box as not been completely filled by the wafers, filling an empty space, for example with further wafer frames or protection plates, before the closing of the wafer box (at 1152).

FIG. 10C shows a flow diagram 1103 for a method for removing protected wafers from a wafer box according to various embodiments, for example as described with reference to FIG. 8.

In various embodiments, the method for removing protected wafers from a wafer box may have a process of providing a wafer box (at 1113), a process of opening the wafer box by removing its cover (at 1123), a process of removing a wafer protection plate with free space above the wafer (at 1133), and a process of removing a wafer arranged on a wafer frame with elastic carrier film (at 1143).

In various embodiments, the removal of the wafer protection plate (1133) and the removal of the wafer (1143) may be repeated until a desired number of wafers has been removed.

In various embodiments, the method may thereafter furthermore have a process of closing the wafer box (at 1153).

Further embodiments of the method can be described in conjunction with the device, and vice versa.

In various embodiments, a wafer transport system is provided, the design of which permits cost-effective and transport-volume-optimized (for example horizontal) transport of wafers mounted on wafer frames, wherein the wafers may be separated or unseparated and may possibly have a very sensitive surface.

In various embodiments, the separated chips (or dies) can be prevented from striking one another, for example during transport.

In various embodiments, contact of active regions of the wafer with any material (which could for example lead to ionic or organic contamination) during transport can be avoided.

In various embodiments, touching of a surface which may have mechanically sensitive components (for example sensors, membranes and/or solder balls) can be ruled out.

In various embodiments, a generation of particles can be minimized because the system is designed for use without (the conventional) foam.

In various embodiments, the use of (for example additional) intermediate inserts can be dispensed with.

In various embodiments, a vibration of the carrier film can be prevented/reduced.

In various embodiments, touch-free transport can be ensured. This means that touching between critical surfaces on the chip/wafer and packaging material and/or the carrier film (for example the sawing film) during transport can be avoided. Damage to the surfaces and/or contamination by touch can thus be avoided.

In various embodiments, standard wafer boxes already available on the market can be utilized, and thus the vibration of the carrier film (for example the sawing film) and the resulting problems on the wafer during transport can be avoided or prevented.

In various embodiments, processes performed on the wafers, for example an arrangement in the wafer box and/or a removal from the wafer box, may be possible in standard machines.

In various embodiments, an increase of the transport volume can be avoided.

In various embodiments, ionic contamination can be avoided.

In various embodiments, foams as filler material within the wafer box can be avoided, such that an associated generation of particles within the box can be avoided.

In various embodiments, a material can be cleaned and reused.

In various embodiments, special inserts for the wafer box with high rigidity can be provided which can be adapted in terms of their shape to the wafer frame and which can prevent a vibration of the (elastic) carrier film, for example the sawing film, hereinafter also referred to for short as film.

In various embodiments, the carrier film can be supported on a fixed surface and thus have no further free space to vibrate. By means of a special construction (for example as a hollow ring in a frustum/cylinder), touching between the wafer surface and surrounding materials can be ruled out. Thus, quality problems on the wafer, such as for example scratches, imprints and/or instances of ionic surface contamination, can be avoided.

In various embodiments, the use of foam, for example the use of foam for filling a wafer box that has not been completely filled with wafers, can be avoided.

In various embodiments, a fastening of the wafers to the frame within the wafer box can be provided by virtue of the uppermost wafer frame being locked on continuous fixing structures (for example guide webs).

In various embodiments, a closure plate or a closure frame can be utilized, for example for fastening the wafers to the frame. It can thus be made possible to use non-perforated frames and/or frameless wafers.

In various embodiments, costs for consumable material can be lowered. Furthermore, an ecological aspect can be brought to bear through reusability of the components used.

Various embodiments may provide a wafer design with connecting surfaces (also referred to as bond pads) on the chips, because the contamination of said surfaces can be avoided.

In various embodiments, a wafer box with at least one fixing structure (for example at least one guide web) within the wafer box (for example within a receiving space for the wafers or outside the receiving space) for the locking of the wafer frames or of the closure plate or of the closure frame can be provided for use with a flexible loading volume.

In various embodiments, wafer frames with holes for the fixing structures, which may for example be formed as guide rails, can be utilized.

In various embodiments, an integrated wafer frame locking means with a height-adaptable fixing facility by means of a stopper attached to the fixing structure, for example to a web, may be provided.

In various embodiments, a wafer transport device may have a wafer box with at least one fixing structure (for example at least one web), at least one perforated wafer frame and at least one fixing device (for example a stopper).

In various embodiments, the at least one fixing device may have a clamping sleeve composed of plastic, for example a clamping sleeve which, under the action of pressure, can be changed from a conical shape to a cylindrical shape adapted to the fixing structure, for example to a (cylindrical) bar or a hollow cylinder. Here, the plastic can in the conical shape exert pressure on the fixing structure for fastening purposes, and can be unlocked by pressure in order to be deformed to form the cylinder.

In various embodiments, a closure plate can be used to lock the wafer by means of at least one fixing structure (for example at least one fixing web) situated outside the receiving space of the wafer box. Here, it may be provided that the various embodiments can also be usable for wafers without wafer frames (for example unsawn wafers).

In various embodiments, a wafer box is provided. The wafer box may have a housing with a receiving space for receiving at least one wafer arranged above a housing base, at least one fixing structure which is connected to the housing base and which extends from the housing base, and at least one fixing device which is fastenable to the at least one fixing structure at a variable distance from the housing base, wherein the fixing device and the fixing structure are designed such that the at least one wafer for arrangement in the receiving space can be fixed in a position by means of the at least one fixing device fastened to the fixing structure.

In various embodiments, the at least one fixing device may be detachably fastenable to the at least one fixing structure.

In various embodiments, the at least one fixing device may have a clamping device or a screw device.

In various embodiments, the at least one fixing device may be arranged within the receiving space.

In various embodiments, the at least one fixing device may be arranged outside the receiving space.

In various embodiments, the wafer box may furthermore have a closure element with at least one guide opening for receiving the at least one fixing structure, wherein the at least one wafer may be fixable in the position indirectly by means of the at least one fixing device and directly by means of the closure element.

In various embodiments, the closure element can be arranged so as to extend from the receiving space as far as outside the receiving space, and such that here, at least the at least one guide opening is arranged outside the receiving space.

In various embodiments, a method for arranging wafers in a wafer box having a housing with a receiving space for receiving at least one wafer arranged above a housing base, having at least one fixing structure which is connected to the housing base and which extends from the housing base, and having at least one fixing device which is fastenable to the at least one fixing structure at a variable distance from the housing base, is provided. The method may have the processes of positioning at least one wafer in the receiving space, and fixing the wafer in its position by fastening of the at least one fixing device to the at least one fixing structure.

In various embodiments, a wafer protection plate for protecting at least one wafer arranged on a wafer frame with elastic carrier film is provided. The wafer protection plate may have a support region for support on a rigid region of the wafer frame, an inner region, and a contact region between the inner region and the support region, wherein the wafer protection plate can be designed and arranged on a top side, which has the wafer, of the wafer frame such that, when the support region is in a supported state, the inner region is arranged above the wafer and the contact region extends in the direction of the carrier film to such an extent that, in the event of contact between the carrier film and the contact region, the top side of the wafer is not in contact with the wafer protection plate.

In various embodiments, when the wafer frame is not moved, the contact region may be in contact with the carrier film or have a spacing of at most 1 mm from the carrier film.

In various embodiments, the wafer protection plate may have, in the inner region, at least one layer of a rigid material.

In various embodiments, the wafer protection plate may be free from material in the inner region.

In various embodiments, the support region may, by means of a surface which is inclined in relation to a plane of the wafer protection plate, be in contact with a beveled part of the rigid region of the wafer frame.

In various embodiments, the inclined surface and the beveled part may be substantially parallel to one another.

In various embodiments, a top side, which is averted from the wafer frame, of the wafer protection plate may extend in a direction away from the carrier film at most as far as an uppermost surface of the top side of the wafer frame.

In various embodiments, the support region may be in contact with an uppermost surface of a top side, which is averted from the carrier film, of the wafer frame.

In various embodiments, a method for protecting at least one wafer arranged on a wafer frame with elastic carrier film is provided. The method may have the process of arranging a wafer protection plate with a support region, an inner region and a contact region between the inner region and the support region on a top side, which has the wafer, of the wafer frame such that the support region is supported on a rigid region of the wafer frame and the inner region is arranged above the wafer, wherein the contact region may extend in the direction of the carrier film to such an extent that, in the event of contact between the carrier film and the contact region, the top side of the wafer is not in contact with the wafer protection plate.

In various embodiments, the method may furthermore have the process of arranging the wafer frame in a wafer box, wherein the arrangement of the wafer protection plate may involve an arrangement in the wafer box.

In various embodiments, the method may furthermore have the process s of, after the arrangement of the wafer frame and of the wafer protection plate, arranging at least one further wafer frame, and arranging a further wafer protection plate.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A wafer protection plate for protecting at least one wafer arranged on a wafer frame with elastic carrier film, the wafer protection plate comprising:
    a support region;
    an inner region; and
    a contact region extending horizontally between the inner region and the support region so as to at least partially surround the inner region, wherein a bottom surface of the inner region is recessed with respect to a bottom surface of the contact region, the bottom surfaces of the contact region and the inner region facing in a direction opposite to a top side of the wafer protection plate.

2. The wafer protection plate of claim 1,
    wherein the contact region is configured to be in contact with the carrier film or has a spacing of at most 1 mm from the carrier film when the wafer protection plate is arranged on a top side of the wafer frame in a rest state.

3. The wafer protection plate of claim 1,
    wherein the inner region comprises at least one layer of a rigid material.

4. The wafer protection plate of claim 1,
    wherein the support region comprises a surface inclined in relation to a horizontal direction.

5. The wafer protection plate of claim 4, wherein the inclined surface of the support region is configured to contact a beveled part of the wafer frame.

6. The wafer protection plate of claim 5,
    wherein the inclined surface and the beveled part are substantially parallel to one another.

7. The wafer protection plate of claim 1,
    wherein a top side of the wafer protection plate facing away from the wafer frame extends in a direction away from the carrier film at most as far as an uppermost surface of the top side of the wafer frame when then the wafer protection plate is arranged on the wafer frame.

8. The wafer protection plate of claim 1,
    wherein the support region is configured to contact an uppermost surface of a top side of the wafer frame.

9. The wafer protection plate of claim 1,
    wherein a thickness of the contact region is greater than a thickness of the inner region, the thicknesses being measured vertically.

10. The wafer protection plate of claim 9,
    wherein a top side of each of the inner region, the contact region, and the support region of the wafer protection plate are coplanar.

11. The wafer protection plat of claim 1, further comprising an aperture disposed horizontally between the contact region and the support region.

12. The wafer protection plate of claim 1, wherein the contact region and/or the support region have closed ring shape.

13. The wafer protection plate of claim 1, wherein the bottom surfaces of the contact region and the inner region are planar and are parallel to each other.

14. The wafer protection plate of claim 1, wherein the wafer protection plate is configured to be arranged on a wafer frame so that the support region suspends at least a portion of the wafer protection plate above the wafer frame.

15. The wafer protection plate of claim 1, wherein the wafer protection plate is configured to be arranged on a wafer frame so that the bottom surfaces of the inner region and the contact region face a top side of the wafer frame.

16. The wafer protection plate of claim 15, wherein the wafer protection plate is configured to be arranged on the wafer frame so that a wafer resting on the wafer frame fits in a space between the top side of the wafer frame and the bottom surface of the inner region.

17. A wafer protection plate for protecting at least one wafer arranged on a wafer frame with elastic carrier film, the wafer protection plate comprising:
    a support region;
    an inner region; and
    a contact region extending along a horizontal direction between the inner region and the support region so as to be in physically connection with the inner region and the support region;
    wherein the wafer protection plate is configured to be arranged on a wafer frame so that the inner region is disposed directly above a wafer resting on the wafer frame and so that a spacing between a bottom surface of the contact region and the top side of the wafer frame along a vertical direction is less than a spacing between a bottom surface of the inner region and the top side of the wafer frame along the vertical direction.

18. A wafer protection plate for protecting at least one wafer arranged on a wafer frame with elastic carrier film, the wafer protection plate comprising:
    a support region;
    an inner region, the inner region comprising a through hole extending vertically through the wafer protection plate; and
    a contact region extending along horizontally between the inner region and the support region so as to at least partially surround the inner region,
    wherein the wafer protection plate is configured to be arranged on a wafer frame so that the bottom surface of the contact region face a top side of the wafer frame and so that a wafer resting on the wafer frame fits at least partially in the through hole of the inner region.

* * * * *